(12) United States Patent
Fujii

(10) Patent No.: US 8,242,486 B2
(45) Date of Patent: Aug. 14, 2012

(54) SEMICONDUCTOR DEVICE WITH LIQUID REPELLANT LAYER

(75) Inventor: Gen Fujii, Sagamihara (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 978 days.

(21) Appl. No.: 11/795,510

(22) PCT Filed: Feb. 7, 2006

(86) PCT No.: PCT/JP2006/302420
§ 371 (c)(1),
(2), (4) Date: Jul. 18, 2007

(87) PCT Pub. No.: WO2006/085637
PCT Pub. Date: Aug. 17, 2006

(65) Prior Publication Data
US 2008/0087982 A1  Apr. 17, 2008

(30) Foreign Application Priority Data
Feb. 10, 2005  (JP) ................. 2005-035258

(51) Int. Cl.
*H01L 35/24* (2006.01)
*H01L 51/00* (2006.01)

(52) U.S. Cl. ............. 257/40; 257/530; 257/632

(58) Field of Classification Search ........... 257/40, 257/530
See application file for complete search history.

(56) References Cited

U.S. PATENT DOCUMENTS

| | | | |
|---|---|---|---|
| 4,409,604 A | 10/1983 | Forland | |
| 5,166,556 A | 11/1992 | Hsu et al. | |
| 5,206,665 A | 4/1993 | Kawade et al. | |
| 5,389,475 A | 2/1995 | Yanagisawa et al. | |
| 5,502,326 A * | 3/1996 | Slotboom et al. | ............. 257/530 |
| 5,565,702 A | 10/1996 | Tamura et al. | |
| 5,579,135 A | 11/1996 | Kajiyama et al. | |

(Continued)

FOREIGN PATENT DOCUMENTS

EP  0 224 418  6/1987

(Continued)

OTHER PUBLICATIONS

International Search Report (Application No. PCT/JP2006/302420) dated May 16, 2006.

(Continued)

*Primary Examiner* — Ha Tran T Nguyen
*Assistant Examiner* — Raj R Gupta
(74) *Attorney, Agent, or Firm* — Eric J. Robinson; Robinson Intellectual Property Law Office, P.C.

(57) ABSTRACT

An object is to provide technology for manufacturing a higher-reliability memory device and a semiconductor device that is equipped with the memory device at low cost. A semiconductor device of the present invention has a first conductive layer, a first insulating layer that is provided to be in contact with a side end portion of the first conductive layer, a second insulating layer that is provided over the first conductive layer and the first insulating layer, and a second conductive layer that is provided over the second insulating layer. The second insulating layer is formed of an insulating material, and wettability against a fluidized substance when the insulating material is fluidized, is higher for the first insulating layer than the first conductive layer.

14 Claims, 18 Drawing Sheets

U.S. PATENT DOCUMENTS

| | | | |
|---|---|---|---|
| 5,641,985 | A | 6/1997 | Tamura et al. |
| 5,679,974 | A | 10/1997 | Shinriki et al. |
| 5,759,876 | A | 6/1998 | Singlevich et al. |
| 5,883,397 | A | 3/1999 | Isoda et al. |
| 6,144,074 | A * | 11/2000 | Akita ............................ 257/355 |
| 6,319,315 | B1 | 11/2001 | Sanjoh |
| 6,528,815 | B1 | 3/2003 | Brown et al. |
| 6,723,396 | B1 | 4/2004 | Patrick |
| 6,768,157 | B2 | 7/2004 | Krieger et al. |
| 6,809,952 | B2 | 10/2004 | Masui |
| 6,828,685 | B2 | 12/2004 | Stasiak |
| 6,858,270 | B2 | 2/2005 | Patrick |
| 6,864,123 | B2 * | 3/2005 | Shimoda ....................... 438/130 |
| 6,903,397 | B2 | 6/2005 | Asakawa |
| 6,947,321 | B2 | 9/2005 | Tanabe |
| 6,950,331 | B2 | 9/2005 | Yang et al. |
| 7,211,502 | B2 | 5/2007 | Yamazaki et al. |
| 7,585,783 | B2 | 9/2009 | Nakamura et al. |
| 7,713,578 | B2 | 5/2010 | Hirai |
| 2001/0039124 | A1 | 11/2001 | Shimoda |
| 2002/0161074 | A1* | 10/2002 | Zhang et al. .................... 524/88 |
| 2004/0057323 | A1 | 3/2004 | Tanabe |
| 2004/0241980 | A1* | 12/2004 | Yamazaki et al. ............ 438/632 |
| 2005/0112906 | A1* | 5/2005 | Maekawa et al. ............. 438/795 |
| 2006/0263634 | A1 | 11/2006 | Yamazaki |
| 2008/0099878 | A1 | 5/2008 | Yukawa et al. |
| 2009/0314203 | A1 | 12/2009 | Nakamura et al. |

FOREIGN PATENT DOCUMENTS

| | | |
|---|---|---|
| EP | 0 501 120 | 9/1992 |
| EP | 0 599 388 | 8/2000 |
| EP | 1482556 A | 12/2004 |
| JP | 07-022669 | 1/1995 |
| JP | 08-153799 A | 6/1996 |
| JP | 2001-274344 | 10/2001 |
| JP | 2002-516028 | 5/2002 |
| JP | 2005-019955 A | 1/2005 |
| WO | WO 97/16851 | 5/1997 |
| WO | WO-2004/097915 | 11/2004 |

OTHER PUBLICATIONS

Written Opinion (Application No. PCT/JP2006/302420) dated May 16, 2006.

International Search Report (Application No. PCT/JP2006/302417) Dated May 16, 2006.

Written Opinion (Application No. PCT/JP2006/302417) Dated May 16, 2006.

* cited by examiner

US 8,242,486 B2

SEMICONDUCTOR DEVICE WITH LIQUID REPELLANT LAYER

TECHNICAL FIELD

The present invention relates to a semiconductor device and a manufacturing method of a semiconductor device.

BACKGROUND ART

In recent years, object recognition technology which can be useful in production, management, etc., by assigning IDs (identification numbers) to individual objects and keeping their accurate track records, has attracted much attention. Further, semiconductor devices that can send and receive data without contact have been in development. As such semiconductor devices, RFIDs (abbreviation of Radio Frequency Identification; also referred to as ID tags, IC tags, IC chips, RF tags (Radio Frequency), wireless tags, electronic tags, and wireless chips) and the like are beginning to be adopted within companies, markets, and the like.

Many of these semiconductor devices each includes an antenna, and a circuit (hereinafter also referred to as IC (Integrated Circuit) chips) using a semiconductor substrate of silicon (Si) or the like, in which the IC chip is made of a memory circuit (hereinafter also referred to as memory), a control circuit, and the like. Also, the development of organic thin film transistors (hereinafter also referred to as TFTs), organic memory and the like using organic compounds in their control circuits, memory circuits and the like, is actively pursued (for example, Japanese Patent Laid-Open No. H7-22669).

DISCLOSURE OF INVENTION

However, in a memory circuit using an organic compound in which a memory element is formed by providing an organic compound between a pair of electrodes, current does not flow easily depending on the thickness of the organic compound layer or the size of the memory circuit, and thus the rise in writing voltage becomes a problem.

Therefore, it is also an object of the present invention to provide technology for manufacturing a higher-reliability memory device and semiconductor device at low cost by lowering the writing voltage.

When the temperature of a substance containing an insulating material rises to the glass-transition temperature of the material, the substance becomes fluid. Therefore, an insulating layer made of the substance containing an insulating material becomes a fluid composition at or over the glass-transition temperature and does not maintain a constant form, and behaves like a liquid. When the insulating layer becomes a fluid composition, the wettability of the surface of a formation region which would not be affected much in a solid state begins to affect the form of the composition, and this significantly influences the direction, speed, etc. of the composition's flow.

The wettability of a solid surface that is a formation substance is affected by the chemical property of the surface. If the substance has a low wettability against a fluid composition, then the surface becomes a region having a low wettability against the fluid composition (hereinafter also referred to as a low wettability region). On the other hand, if the substance has a high wettability against a fluid composition, then the surface becomes a region having a high wettability against the fluid composition (hereinafter also referred to as a high wettability region). As for the present invention, the wettability of a formation region surface is controlled by choices in material and process treatments. This is so that in a case where an insulating layer changes into a fluid composition after voltage is applied and the temperature becomes at or over its glass-transition temperature, the insulating layer will be formed above a region having a different wettability.

The region having a different wettability is a region having a difference in wettability against the fluid composition, and where the contact angle of the fluid composition is different. A region where the contact angle of the fluid composition is large is a region with low wettability (hereinafter also referred to as a low wettability region), and a region where the contact angle is small is a region with high wettability (hereinafter also referred to as a high wettability region). When the contact angle is large, the fluid composition does not wet a region surface because it is repelled and does not expand on the surface. On the other hand, when the contact angle is small, the fluid composition expands on the surface, and wets the surface well. Therefore, the region with the different wettability is also different in surface energy. The surface energy of a region with low wettability is low, and the surface energy of a region with high wettability is high.

In the present invention, an insulating layer, also referred to as a memory layer, that makes up a part of a memory element that is included in a memory device, is formed so as to be in contact with a first conductive layer, and a partition (insulating layer) that covers an end portion of the first conductive layer or formed so as to be in contact with and surround the end portion of the first conductive layer. When voltage is applied between the first conductive layer and a second conductive layer, current flows to the insulating layer and heat is generated. When the temperature of the insulating layer rises to its glass-transition temperature and the insulating layer turns into a fluid composition, the wettability against the fluid composition is to be higher for the partition (insulating layer) surface than the surface of the first conductive layer. The fluid composition moves in the direction where there is higher wettability, so the fluid composition flows to the partition (insulating layer) which has higher wettability, without maintaining a form during it was solid. Consequently, the thickness of the insulating layer becomes uneven and the insulating layer changes shape, and the first conductive layer and the second conductive layer are short-circuited. Furthermore, there is also a case in which an electric field is concentrated in a region where the insulating layer is thin, and a dielectric breakdown occurs, which short-circuits the first and second conductive layers. Consequently, the conductivity of the memory element is different before and after voltage application. It is to be noted that in a memory layer, which is referred to as an insulating layer and included in a memory element in the present specification, a small amount of current flows through when the material of the memory layer is in a thin film state, whereas in a bulk state, an insulating property is exhibited.

Note that in the present invention, a semiconductor device refers to a device that can function by utilizing a semiconductor characteristic. By using the present invention, it is possible to manufacture a semiconductor device such as a chip having a processor circuit (hereinafter also referred to as a processor chip), and the like.

One aspect of a semiconductor device of the present invention is to have a first conductive layer, a first insulating layer that is in contact with a side end portion of the first conductive layer, a second insulating layer over the first conductive layer and the first insulating layer, and a second conductive layer over the second insulating layer. The second insulating layer is formed of an insulating material, and the wettability against a fluidized substance when the insulating material is fluidized, is higher for the first insulating layer than the first conductive layer.

Another aspect of a method of manufacturing a semiconductor device of the present invention is to include the steps of forming a first conductive layer, forming a first insulating layer to be in contact with a side end portion of the first conductive layer, forming a second insulating layer over the first conductive layer and the first insulating layer, and forming a second conductive layer over the second insulating layer. The second insulating layer is formed by an insulating material, and the wettability against a fluidized substance when the insulating material is fluidized, is higher for the first insulating layer than the first conductive layer.

Yet still another aspect of a method for manufacturing a semiconductor device of the present invention is to include the steps of forming a first conductive layer having a liquid repellant layer, forming a first insulating layer to be in contact with a side end portion of the first conductive layer, forming a second insulating layer over the first conductive layer and the first insulating layer, and forming a second conductive layer over the second insulating layer.

By the present invention, a higher-reliability semiconductor device having lower writing voltage can be manufactured at low cost.

BRIEF DESCRIPTION OF DRAWINGS

In the accompanying drawings.

BEST MODE FOR CARRYING OUT THE INVENTION

Figure 1A:
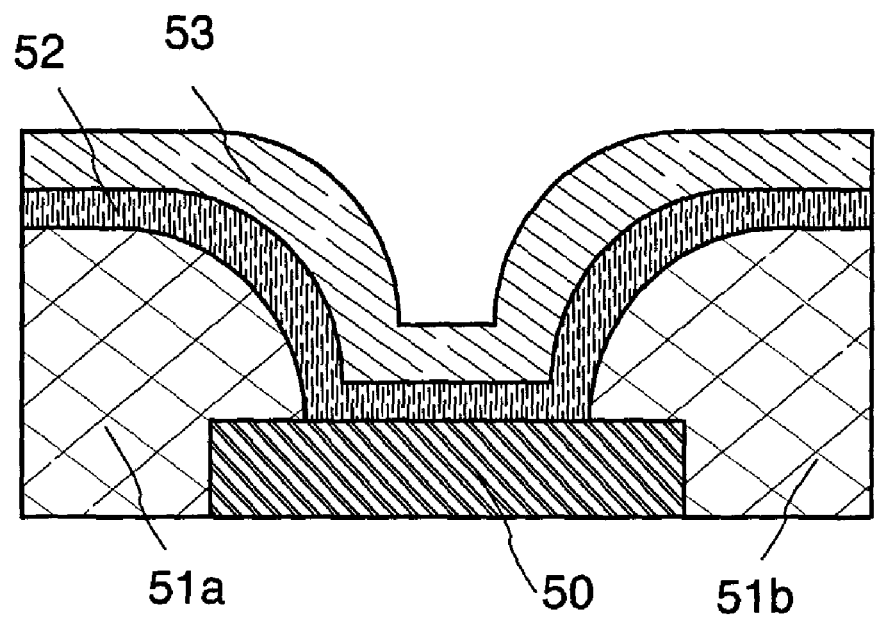
FIGS. 1A and 1B are schematic diagrams describing the present invention.

Embodiment modes according to the present invention will hereinafter be described with reference to the accompanying drawings. However, the present invention is not limited to the descriptions below, and it is easily understood by those skilled in the art that modes and details herein disclosed can be modified in various ways without departing from the spirit and the scope of the present invention. Therefore, the present invention should not be interpreted as being limited to the description of the embodiment modes to be given below. It should be noted that in the structures of the present invention described below, the same reference numerals are used for the same portions and portions with similar functions between different figures, and the descriptions thereof are omitted.

Embodiment Mode 1

In this embodiment mode, one example of a structure of a memory element included in a memory device of the present invention will be described with reference to drawings. More specifically, a case where the structure of a memory device is a passive matrix type will be described.

Figure 1B:
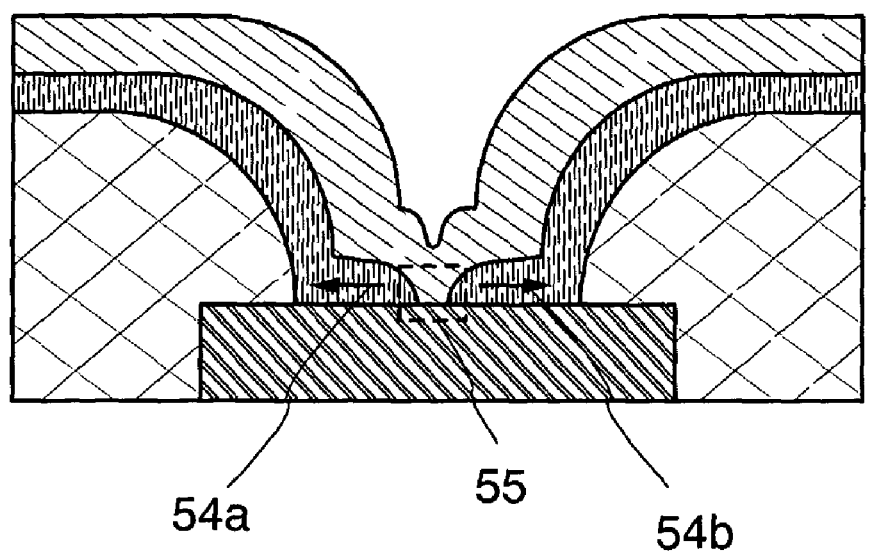

A memory element of the present invention and an operation mechanism thereof will be described with reference to FIGS. 1A and 1B. In FIGS. 1A and 1B, a partition (insulating layer) 51a and a partition (insulating layer) 51b are provided so as to cover the end portions of a first conductive layer 50. The partitions (insulating layers) 51a and 51b also serve as partitions to separate a memory element from other memory elements. Then, an insulating layer 52 is formed over the partitions (insulating layers) 51a and 51b, and the first conductive layer 50. Furthermore, a second conductive layer 53 is formed over the insulating layer 52.

As materials for the first conductive layer 50 and the second conductive layer 53, an element, a compound, or the like with high conductivity is used. For a material of the insulating layer 52, a substance that changes in form, conductivity, or crystallinity by an electrical effect or an optical effect is used in this embodiment mode. Since the conductivity of the memory element having the above structure changes before and after applying voltage, two values corresponding to an "initial condition" and a "post conductivity change" can be stored in memory. The change in the conductivity of the memory element before and after applying voltage will be explained.

A substance including an insulating material, which forms an insulating layer, becomes fluid when the temperature rises to the glass-transition temperature of the material. Therefore, the insulating layer becomes a fluid composition at or over the glass-transition temperature and does not maintain a constant form, and behaves like a liquid. When the substance including an insulating material becomes a fluid composition, the wettability of the surface of a formation region which would not be affected much if the substance including an insulating material is in a solid state, begins to affect the form of the composition, and this significantly influences the direction, speed, etc., of the composition's flow.

The wettability of a solid surface that is a formation substance is affected by the chemical property of the surface. If the substance has a low wettability against a fluid composition, then the surface becomes a low wettability region for the fluid composition. On the other hand, if the substance has a high wettability against a fluid composition, then the surface becomes a high wettability region for the fluid composition. As for the present invention, the wettability of a formation region surface is controlled by choices in material and process treatments. This is so that in a case where an insulating layer changes into a fluid composition and the temperature becomes at or over its glass-transition temperature after voltage is applied, the insulating layer will be formed over a region having a different wettability.

The region having a different wettability is a region having a difference in wettability against the fluid composition, and where the contact angle of the fluid composition is different. A region where the contact angle of a fluid composition is large is a lower wettability region, and a region where the contact angle is small is a higher wettability region. When the contact angle is large, a fluid composition does not wet a region surface because it is repelled and does not expand on the surface. On the other hand, when the contact angle is small, a fluid composition expands, and wets the surface well. Therefore, a region with a different wettability is also different in surface energy. The surface energy of a region with low wettability is low, and the surface energy of a region with high wettability is high.

In this embodiment mode, the insulating layer 52 is formed so as to be in contact with the first conductive layer 50, and the partitions (insulating layers) 51a and 51b which cover the end portions of the first conductive layer 50. When voltage is applied between the first conductive layer 50 and the second conductive layer 53, current flows to the insulating layer 52 and heat such as Joule heat is generated. When the temperature of the insulating layer 52 rises to its glass-transition temperature and the insulating layer 52 turns into a fluid composition, the wettability against the fluid composition is to be higher for the surfaces of the partitions (insulating layers) 51a and 51b, than the surface of the first conductive layer 50. The difference between the contact angles of the first conductive layer 50 surface and the surfaces of the partitions (insulating layers) 51a and 51b, against an insulating material that forms the insulating layer which turns into a fluid compound, is preferably 30° or larger; more preferably, 40°. Further, since it is acceptable as long as the film thickness of the insulating layer above the first conductive layer 50 becomes uneven, by the material forming the insulating layer moving above the first conductive layer 50, either the surface wettability of partition (insulating layer) 51a or partition (insulating layer) 51b needs to be higher than that of the first conductive layer 50 surface.

The fluid composition moves in the direction where there is higher wettability, and flows to the partitions (insulating layers) 51a and 51b which have high wettability, in the directions as indicated by an arrow 54a and an arrow 54b without maintaining a form during it was solid. Subsequently, the thickness of the insulating layer 52 becomes uneven and the insulating layer changes shape, wherein the first conductive layer 50 and the second conductive layer 53 partially comes in contact with each other as shown by region 55 in FIG. 1B. As a result, the first conductive layer 50 and the second conductive layer 53 are short-circuited. Furthermore, there is also a case in which an electric field becomes concentrated in a region where the insulating layer is thin, and a dielectric breakdown occurs, which short-circuits the first and second conductive layers. Consequently, the conductivity of the memory element is different before and after voltage application.

As a result, writing can be carried out with low power consumption.

Figure 3:
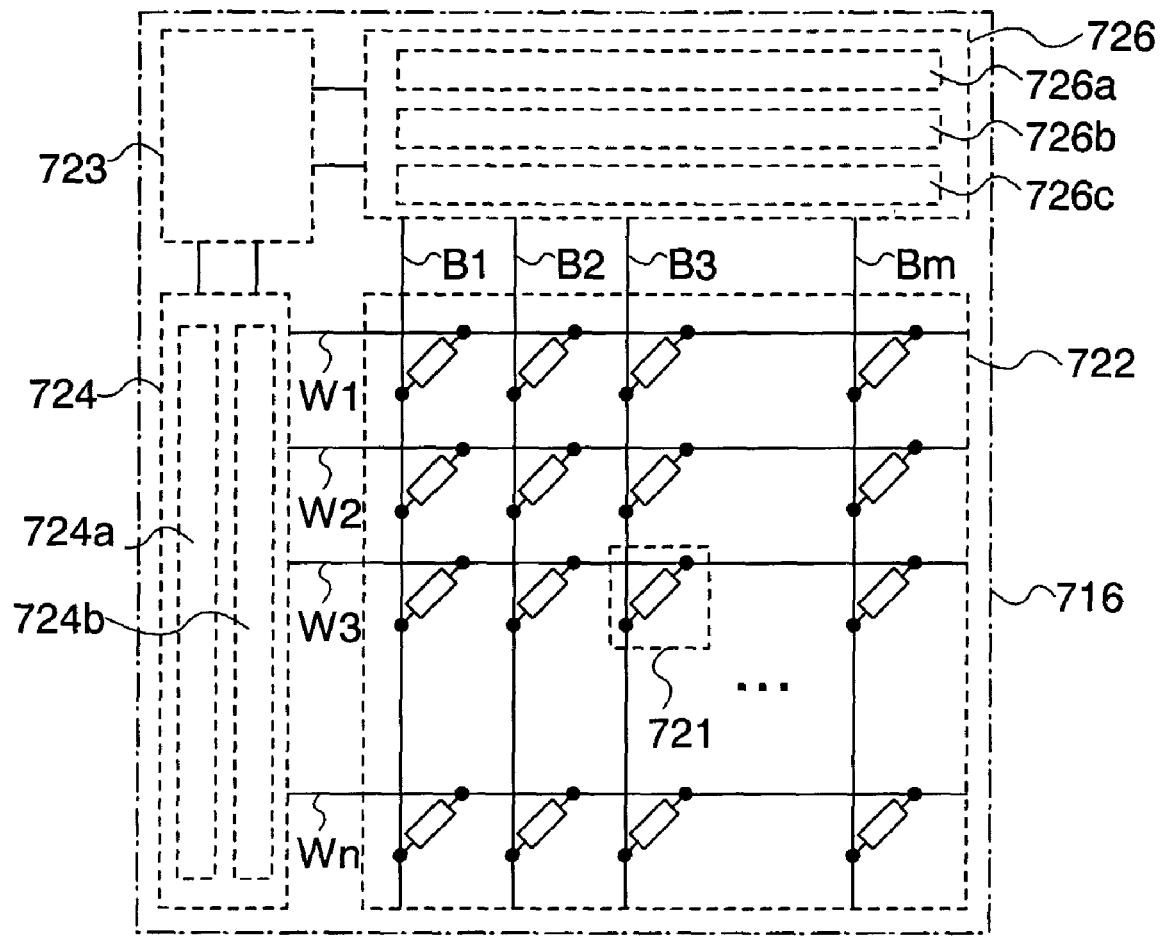
FIG. 3 describes a memory device of the present invention.

One configuration example of a memory device of the present invention is shown in FIG. 3. The configuration example has a memory cell array 722 in which memory cells 721 are provided in a matrix form, a circuit 726 having a readout circuit and a writing circuit, a decoder 724 including a row decoder 724a and a level shifter 724b and a decoder 723. Note that the configuration of the memory device 716 shown here is only one example, and the memory device may have another circuit such as a sense amplifier, an output circuit, a buffer, an interface that carries out interactions with the exterior, or the like.

The memory cell 721 has first conductive layers each is connected to a bit line Bx ($1 \leq x \leq m$), second conductive layers each is connected to a word line Wy ($1 \leq y \leq n$), and an insulating layer. The insulating layer is provided as a single layer or as a lamination of layers between the first conductive layer and the second conductive layer.

Figure 2A:
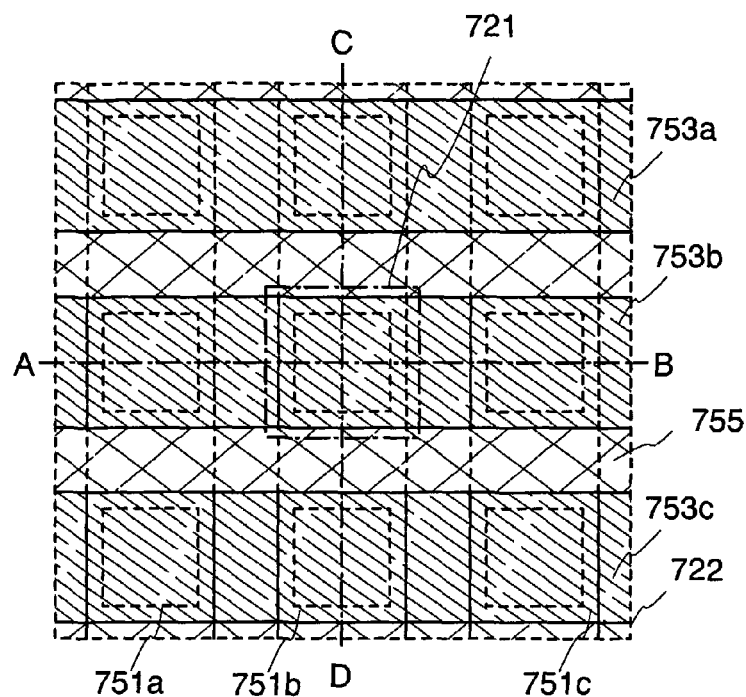
FIGS. 2A to 2C describe a memory device of the present invention.
Figure 2B:
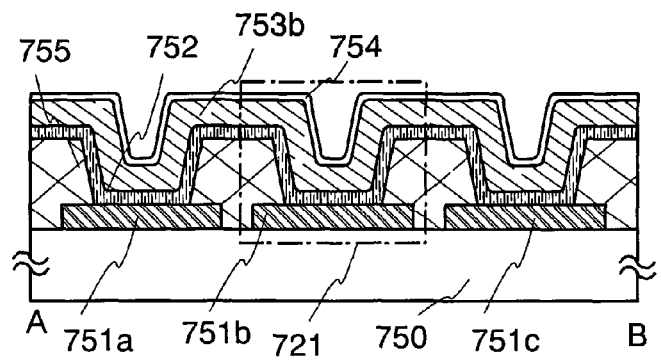
Figure 2C:
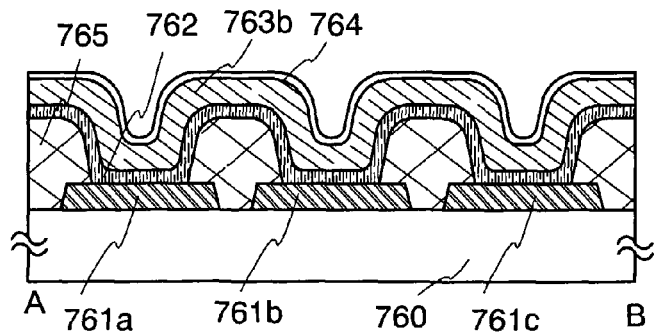

A top view of the memory cell array 722 is shown in FIG. 2A, and a cross-sectional view of the figure in FIG. 2A along the line A-B is shown in FIG. 2B, as well as in FIG. 2C. Note that in FIG. 2A, an insulating layer 752 and an insulating layer 754 are not shown, but they are provided in the memory cell array 722, as shown in FIG. 2B.

The memory cell array 722 has first conductive layers 751a, 751b, and 751c that extend in a first direction; an insulating layer 752 that is provided to cover the first conductive layers 751a, 751b, and 751c; and second conductive layers 753a, 753b, and 753c that extend in a second direction which is perpendicular to the first direction (refer to FIG. 2A). The insulating layer 752 is provided between the first conductive layers 751a, 751b, and 751c, and the second conductive layers 753a, 753b, and 753c. Furthermore, an insulating layer 754 is provided to cover and function as a protective film for the second conductive layers 753a, 753b, and 753c (refer to FIG. 2B). Note that in a case where there is concern for an effect of an electric field in the lateral direction in between each memory cell, that are adjacent to each other, the insulating layer 752 that is provided for each memory cell may be separated.

FIG. 2C is an example of a shape change in the figure in FIG. 2B, and has first conductive layers 761a, 761b, and 761c, partitions (insulating layers) 765, an insulating layer 762, a second conductive layer 763b, and an insulating layer 764 which is a protective layer, over a substrate 760. As in the first conductive layers 761a, 761b, and 761c in FIG. 2C, the first conductive layer may have a sloped end portion and the partitions (insulating layers) 765 covering the end portions may have a form in which the curvature radius changes continuously. Such a form as the form of the partitions (insulating layers) 765 can be formed by using a droplet discharging method or the like. When the curved surface of the partitions (insulating layers) 765 have such curvature, the coverage of an insulating layer and a conductive layer to be layered is good.

When the difference in wettability is large between the surface of a first conductive layer and the surface of a partition (insulating layer), which are formation substances for an insulating layer, against a composition in which an insulating material that forms the insulating layer is fluidized, the fluidized composition moves more freely. This is because the fluid composition cannot stay since it is repelled by the first conductive layer surface which is a low wettability region, and is pulled towards the partition (insulating layer) which is a high wettability region.

Figure 15A:
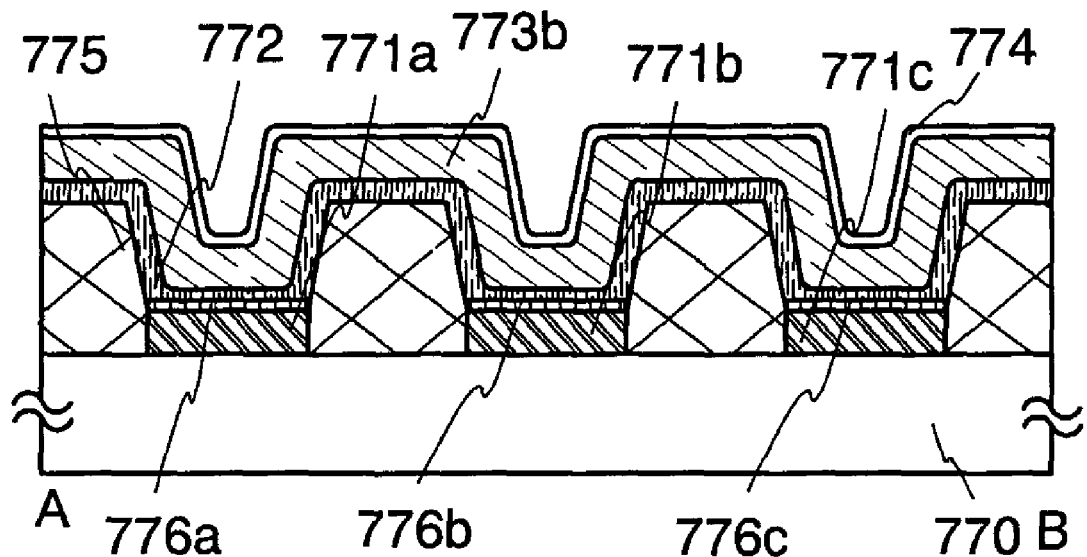
FIGS. 15A and 15B each describes a memory device of the present invention.

In order to make the difference in wettability large in this manner, a first conductive layer surface can be treated so as to be a still lower wettability region. This can be done by forming a substance having low wettability over the first conductive layer, and making an even more liquid repellant low wettability region. FIG. 15A shows an example in which liquid repellant layers 776a, 776b, and 776c that are made of a substance having low wettability, are formed over first conductive layers 771a, 771b, and 771c respectively. In this embodiment mode, partitions (insulating layers) 775 are solidified by sticking a liquid composition including an insulating material, then baking, drying, etc. Therefore, it does not have a structure of covering the end portions of the first conductive layers 771a, 771b, and 771c, but it is formed so as to be in contact with the side end portions of the first conductive layers 771a, 771b, and 771c. With such a structure, the partitions (insulating layers) can be formed with stability since it does not touch a liquid repellant layer even when the liquid repellant layers 776a, 776b, and 776c are formed over the first conductive layers 771a, 771b, and 771c, as in FIG. 15A. However, when the partitions (insulating layers) are formed using a dry process such as an evaporation method, the partition (insulating layer) may cover the end portions of a first conductive layer even when the first conductive layer has a liquid repellant layer on its entire surface. An insulating layer 772, a second conductive layer 773b, and a protective film (insulating layer) 774 are formed by a dry process such as an evaporation method over the liquid repellant layers 776a, 776b, and 776c. Further, the liquid repellant layers may have a thickness of several nanometers, and depending on the formation method, film continuity is not required.

As the substance having low wettability, a substance including a fluorocarbon group (fluorocarbon chain), or a substance including a silane coupling agent can be used. Since a silane coupling agent can form a monomolecular film, decomposition and reforming can be carried out efficiently, and wettability can change in a short amount of time. Also, the monomolecular film can be considered as a self-organized film. Further, a silane coupling agent having a fluorocarbon group (fluorocarbon chain) can be used, but since a silane coupling agent having an alkyl group also exhibits low wettability when it is arranged on a substrate, it can be used as well. Furthermore, since a silane coupling agent's effectiveness in lowering wettability differs depending on whether it includes a fluorocarbon chain or an alkyl group is included as its functional group, a material can be appropriately selected to obtain a necessary wettability.

As the substance having low wettability, a substance including a fluorocarbon group (fluorocarbon chain), or a substance including a silane coupling agent can be used. The silane coupling agent is represented by a chemical formula $R_n$—Si—$X_{(4-n)}$ (n=1, 2, 3). Here, R includes a relatively inert group such as an alkyl group. Also, X is a hydrolysis group in which bonding is possible by condensation with absorption water or a hydroxyl group on a surface of a substrate such as halogen, a methoxy group, an ethoxy group or an acetoxy group.

As the substance having low wettability, alkoxysilane, which is a silane coupling agent that has an alkyl group for R, can also be used. For example, octadecyltrimethoxysilane and the like can be used as an organic silane. Preferably, alkoxysilane having 2 to 30 carbon atoms is used. Typically, decyltrimethoxysilane, ethyltriethoxysilane, propyltriethoxysilane, octyltriethoxysilane, decyltriethoxysilane, dodecyltriethoxysilane, octadecyltriethoxysilane (ODS), eicosyltriethoxysilane, and triacontyltriethoxysilane can be given. Note that, a silane compound having a long chain alkyl group is preferably used since it can particularly decrease wettability. Furthermore, decyltrichlorosilane, tetradecyltrichlorosilane, octadecyltrichlorosilane, eicosyltrichlorosilane, docosyltrichlorosilane, or the like can be used.

As a representative example of the silane coupling agent, by using a fluorine based silane coupling agent (fluoroalkylsilane (FAS)) having a fluoroalkyl group for R, wettability can be lowered even more. The R for FAS has a structure that is expressed as $(CF_3)(CF_2)_x(CH_2)_y$ (x: an integer from 0 to 10, y: an integer from 0 to 4), and when multiple Rs or Xs are bonded with Si, the Rs may all be the same or different, and the Xs may also be all the same or different. Representatively, FAS is a fluoroalkylsilane such as heptadefluoro tetrahydro decyl triethoxysilane, heptadecafluoro tetrahydro decyl trichlorosilane, tridecafluoro tetrahydro octyl trichlorosilane, trifluoropropyl trimethoxysilane, and tridecafluorooctyltrimethoxysilane. Furthermore, a coupling agent having halogen as its hydrolysis group such as tridecafluorooctyltrichlorosilane may also be used. Note that it is not limited to the given compounds.

Also, as the substance having low wettability, a titanate coupling agent, or an aluminate coupling agent may be used. For example, isopropyl triiso octanoyl titanate, isopropyl (dioctylpyrophosphate)titanate, isopropyl tri stearoyl titanate, isopropyltris(dioctylpyrophosphate) titanate, isopropyl dimethacryl iso stearoyl titanate, acetoalkoxy aluminum diisopropylate, etc., can be given.

In order to form a substance with low wettability such as the ones mentioned above as a film on a formation region, a vapor-phase deposition method can be used, in which a liquid form substance is evaporated and a film is formed on a formation region (for example, a substrate). Also, the low wettability substance can also be formed by a spin-coating method, a dipping method, a droplet discharging method, or a printing method (such as screen printing and offset printing), and it may be a solution in which the substance is dissolved in a solvent.

As the solvent of the solution containing the low wettability substance, water, alcohol, ketone, a hydrocarbon solvent (such as aliphatic hydrocarbon, aromatic hydrocarbon, and halogenated hydrocarbon), an ether based compound, or a mixture thereof can be used. For example, methanol, ethanol, propanol, acetone, butanone, n-pentane, n-hexane, n-heptane, n-octane, n-decane, dicyclopentane, benzene, toluene, xylene, durene, indene, tetrahydronaphthalene, decahydronaphthalene, squalene, carbon tetrachloride, chloroform, methylene chloride, trichloroethane, diethyl ether, dioxane, dimethoxy ethane, or tetrahydrofuran is used. There is no particular limit to the concentration of the above mentioned solutions, but it may be in the range of 0.001 to 20 wt %.

Also, amine such as pyridine, triethylamine, or dimethylaniline may be mixed with the above mentioned low wettability substance. Furthermore, a carboxylic acid such as formic acid and acetic acid may be added as a catalytic agent.

For a treatment when forming a monomolecular film using a method such as a spin-coating method, as mentioned above, in which the low wettability substance is stuck onto a formation region in a liquid form, the treatment temperature may be from room temperature (about 25° C.) to 200° C., and the treatment time may be several minutes to 12 hours. A treatment condition may be appropriately set according to the property of the wettability substance, the concentration of the solution, the treatment temperature, and the treatment time.

Also, when a thin film to be formed (regardless of the formation method) is washed with the solvent that can be used when forming the solution containing the above mentioned low wettability substance, a low wettability substance that is not reacted can be removed. At this time, an ultrasonic cleaner or the like may be used.

A film that can be used in the present invention containing the low wettability substance may be a thin film having a film thickness of 0.3 nm to 10 nm. Note that a thin film of the low wettability substance that is formed using a spin-coating method or the like, in which the low wettability substance is deposited in a liquid form onto a formation region, is extremely thin, and it can be a monomolecular film with a film thickness in the range of 0.3 nm to 10 nm.

Further, as an example of a composition that controls to lower the wettability and forms a low wettability region, a material having a fluorocarbon group (fluorocarbon chain) can be used (a fluorine-based resin). As the fluorine-based resin, polytetrafluoroethylene (PTFE; a polytetrafluoroethylene resin), perfluoroalkoxyalkane (PFA; a tetrafluoroethylene perfluoroalkylvinylether copolymer resin), perfluoroethylene propene copolymer (PFEP; a tetrafluoroethylene hexafluoropropylene copolymer resin), ethylene-tetrafluoroethylene copolymer (ETFE; a tetrafluoroethylene-ethylene copolymer resin), polyvinylidene fluoride (PVDF; a polyvinylidene fluoride resin), polychlorotrifluoroethylene (PCTFE; a polytrifluorochloroethylene resin), ethylene-chlorotrifluoroethylene copolymer (ECTFE; a polytrifluorochloroethylene-ethylene copolymer resin), polytetrafluoroethylene-perfluorodioxol copolymer (TFE/PDD), polyvinylfluoride (PVF; a vinyl fluoride resin), or the like can be used.

Figure 15B:
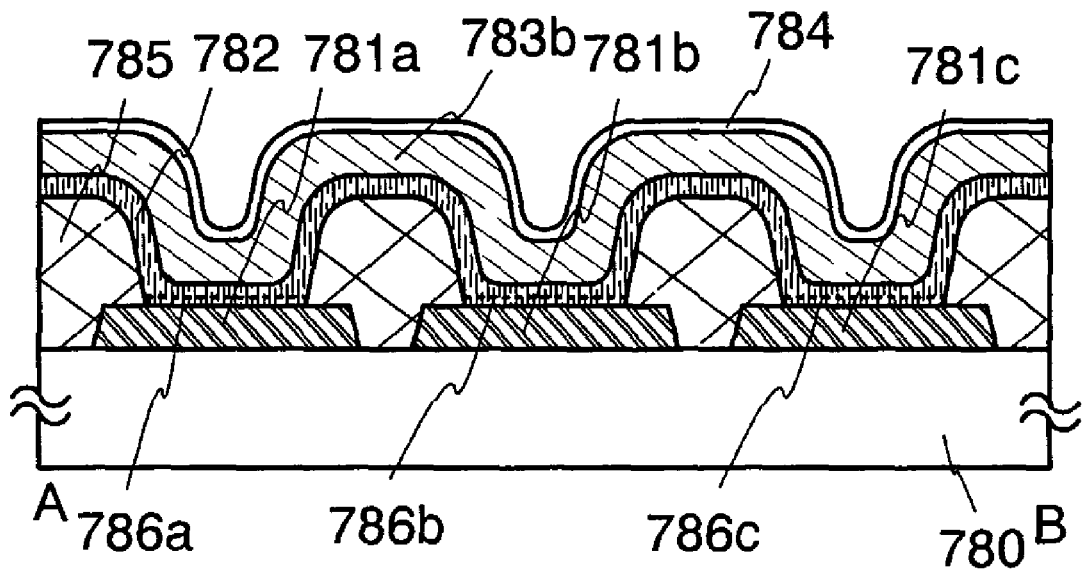

Also, when a plasma treatment is carried out on a conductive layer under a gas atmosphere including fluorine and carbon (for example, $CHF_3$), wettability can be lowered. As shown in FIG. 15B, a plasma treatment is carried out under a gas atmosphere including fluorine on first conductive layers 781a, 781b, and 781c, and the surfaces become liquid repellant regions 786a, 786b, and 786c, respectively. This treatment may be carried out after forming partitions (insulating layers) 785 so as to cover the end portions of the first conductive layers 781a, 781b, and 781c. An insulating layer 782, a second conductive layer 783b, and an insulating layer 784 are formed over the liquid repellant regions 786a, 786b, and 786c by a dry process such as an evaporation method.

Figure 16A:
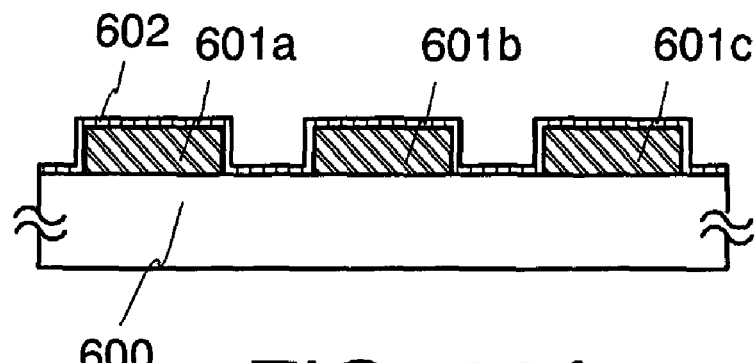
FIGS. 16A to 16C describe a manufacturing method for a memory device of the present invention.
Figure 16B:
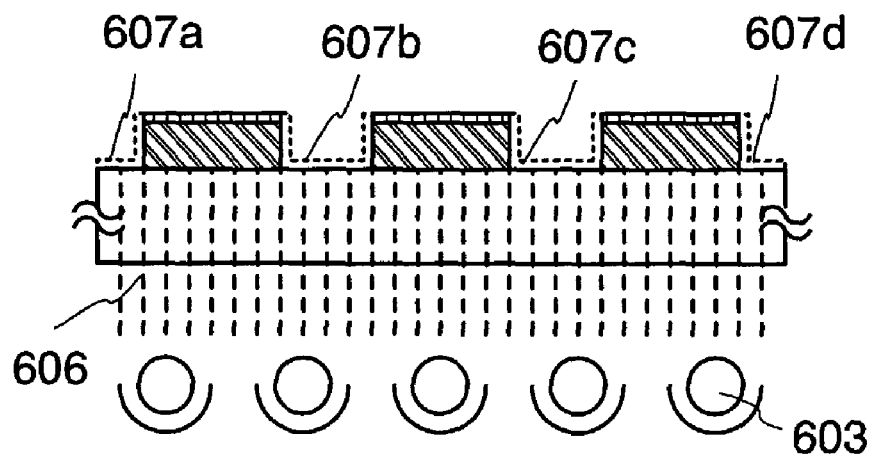
Figure 16C:
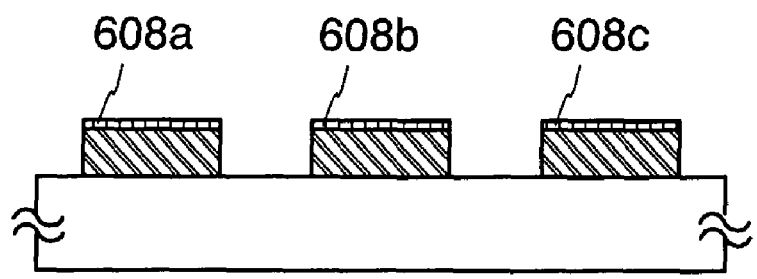

As a method for processing a liquid repellant layer above a first conductive layer into a desired form, a rear-side light exposure can be carried out from the rear side of a substrate using the first conductive layers as masks. Over a substrate 600, first conductive layers 601a, 601b, and 601c are formed, then a liquid repellant layer 602 made of the substance having low wettability is formed by a spin-coating method or the like (refer to FIG. 16A). A reforming treatment is carried out for regions 607a, 607b, and 607c which are portions of the liquid repellant layer 602 that are not masked by the first conductive layers 601a, 601b, and 601c, where a light 606, which is emitted from a light source 603, passes through the substrate 600 and decomposes the liquid repellant layer present on the regions 607a, 607b, and 607c (refer to FIG. 16B). Therefore, liquid repellant layers 608a, 608b, and 608c are processed and formed in a desired form over the first conductive layers 601a, 601b, or 601c, respectively (refer to FIG. 16C).

In order to improve the treatment efficiency of light irradiation, a light absorber that has an absorption region in the wavelength range of light may be interfused in the liquid repellant layer. A light absorber, which has an absorption region in the wavelength range of light, absorbs the emitted light and radiates (radiation) energy such as heat in the surrounding area. The radiated energy acts on a surrounding substance and changes and reforms the physicality of the substance as a result. By using the present invention, a light absorber may be selected according to the wavelength of light, and the selection range of light becomes wider. Therefore, a wavelength region which a substrate does not absorb very well can be selected, and light irradiation for a surface reforming treatment for good controllability, can be carried out. Furthermore, since the irradiation efficiency can also be improved, even if light itself has low energy, sufficient treatment can be carried out. Consequently, since device and operation is simplified, cost and time is reduced, and productivity can also be improved.

For the light absorber, an organic material, an inorganic material, a substance including an inorganic material and an organic material, or the like can be used, and depending on the wavelength of light that is used, a light absorber having an absorption region in the wavelength of light may be selected. It may be a conductive material such as metal, or an insulating material such as an organic resin. As an inorganic material, iron, gold, copper, silicon, germanium or the like can be used. As an organic material, a pigment or a plastic such as polyimide or acrylic can be used. For example, as a pigment that corresponds to a light wavelength of 532 nm, rhodamine B, eosine Y, methyl orange, rose Bengal, or the like can be used; as a pigment that corresponds to a light wavelength from 300 nm to 400 nm, a coumarin based pigment (coumarin 6H, coumarin 30, coumarin 102, coumarin 152, coumarin 153, coumarin 545T, and the like) and Bis-MSB (abbreviation of 1,4-bis(o-methylstyryl)benzene) can be used. As a pigment, carbon black, a black resin of a colorant, or the like can also be used. As another pigment, rhodamine 6G, dicyano methylene pyran derivatives (DCM) or the like can be used.

As the light absorber, a substance having a photocatalytic function (hereinafter simply referred to as a photocatalytic substance) can be used. Since a photocatalytic substance has photocatalytic activity, a photocatalytic substance is activated by light irradiation and the substance surface can be modified by energy thereof.

Figure 17A:
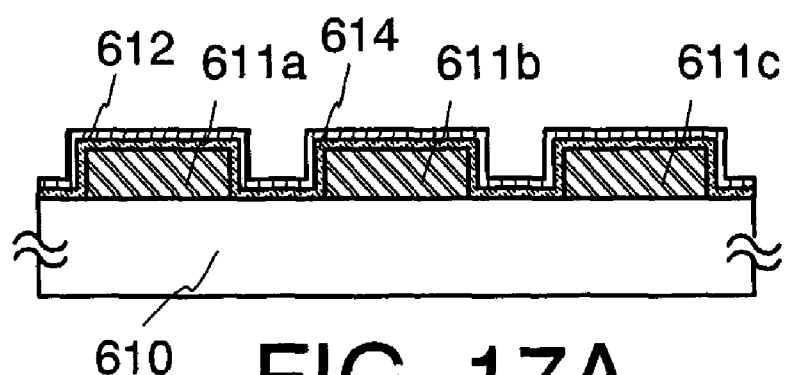
FIGS. 17A to 17C describe a manufacturing method for a memory device of the present invention.
Figure 17B:
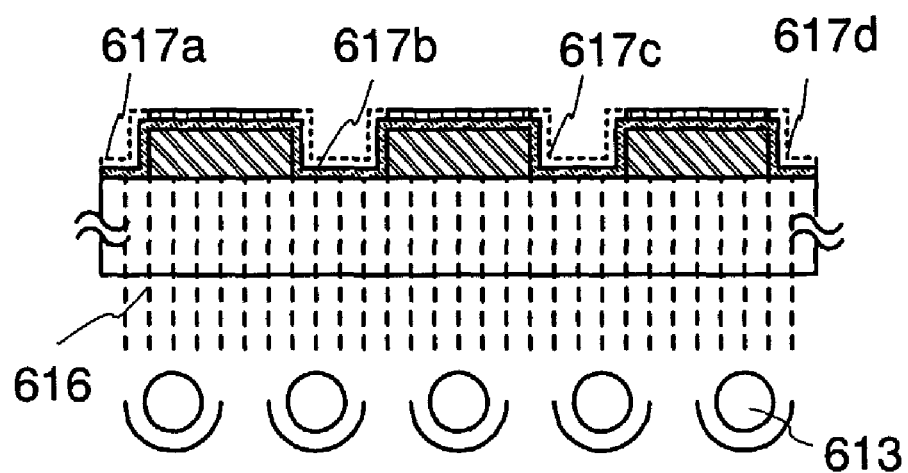
Figure 17C:
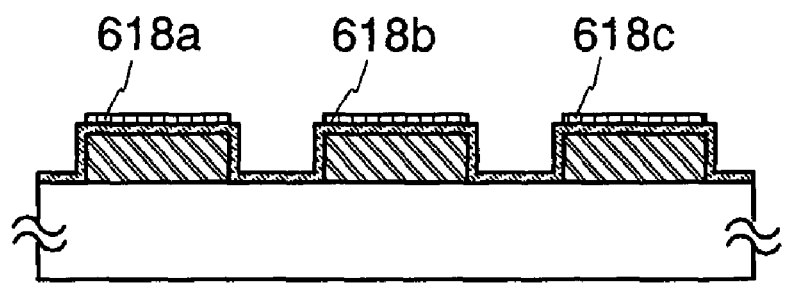

An example of forming a photocatalytic substance as the light absorber is shown in FIGS. 17A, 17B, and 17C. In FIGS. 17A, 17B, and 17C, a light absorbing layer 614 made of a photocatalytic substance is formed to be in contact with first conductive layers 611a, 611b, and 611c which are formed over a substrate 610, and below a liquid repellant layer 612. In a similar fashion, a light 616 that is emitted from a light source 613 passes through the substrate 610, and the light absorbing layer 614 is irradiated with light 616. The light absorber, which has an absorption region in the wavelength range of light, absorbs the emitted light and radiates (radiation) energy such as heat in the surrounding area. The radiated energy acts on the liquid repellant layer 612, decomposes the liquid repellant layer 612 as a result, and reforms regions 617a, 617b, and 617c (refer to FIG. 17B). Consequently, liquid repellant layers 618a, 618b, and 618c are processed and formed in a desired form over the first conductive layer 611a, 611b, and 611c (refer to FIG. 17C). The light absorbing layer 614 may be removed after the liquid repellant layers are processed.

For the photocatalytic substance, titanium oxide ($TiO_x$), strontium titanate ($SrTiO_3$), cadmium selenide (CdSe), potassium tantalate ($KTaO_3$), cadmium sulfide (CdS), zirconium oxide ($ZrO_2$), niobium oxide ($Nb_2O_5$), zinc oxide (ZnO), ferric oxide ($Fe_2O_3$), tungsten oxide ($WO_3$), and the like are preferable. A photocatalytic activity may be brought on by these photocatalytic substances being irradiated with light in the ultraviolet radiation region (wavelength of 400 nm or shorter, preferably 380 nm or shorter).

There is no particular limit to light used in the reforming treatment, and infrared light, visible light, ultraviolet light, or a combination thereof can be used. For example, light emitted from an ultraviolet ray lamp, a black-light, a halogen lamp, a metal halide lamp, a xenon arc lamp, a carbon arc lamp, a high-pressure sodium vapor lamp, or a high-pressure mercury vapor lamp may be used. In this case, the lamp light source may be activated for a necessary period of time for carrying the irradiation or irradiation may be carried out multiple times.

Also, laser light may be used. A laser oscillator that can oscillate ultraviolet light, visible light, or infrared light can be used. As the laser oscillator, a KrF, ArF, XeCl, or Xe excimer laser oscillator or the like; an He, He—Cd, Ar, He—Ne, or HF gas laser oscillator or the like; a solid state laser oscillator using a crystal in which a crystal such as YAG, GdVO$_4$, YVO$_4$, YLF, or YAlO$_3$ is doped with Cr, Nd, Er, Ho, Ce, Co, Ti, or Tm; or a semiconductor laser oscillator such as GaN, GaAs, GaAlAs, or InGaAsP can be used. As for the solid state laser oscillator, applying the fundamental harmonic, the second harmonic, or the third harmonic is preferable. In order to adjust the shape and direction of laser light that is emitted from the laser oscillator, an optical system that is composed by a shutter, a reflector such as a mirror or a half mirror, a cylindrical lens, a convex lens, and the like may be set.

For a substrate 750, a substrate 760, a substrate 770, and a substrate 780 in the structure of the above mentioned memory cell, a quartz substrate, a silicon substrate, a metal substrate, a stainless substrate, or the like can be used other than a glass substrate or a flexible substrate. A flexible substrate is a substrate that can be bent (flexible). For example, a plastic substrate made of polycarbonate, polyalylate, polyethersulfone, or the like can be given. Also, a film (made of polypropylene, polyester, vinyl, polyvinyl fluoride, polyvinyl chloride, or the like), paper made of a fibrous material, a base film (such as polyester, polyamide, inorganic deposition film, and paper), and the like can be used. In addition, a memory cell array 722 can be provided over a field effect transistor (FET) that is formed on a semiconductor substrate such as Si, or over a thin film transistor (TFT) that is formed over a glass substrate or the like.

For the first conductive layers 751a to 751c; the first conductive layers 761a to 761c; the first conductive layers 771a to 771c; the first conductive layers 781a to 781c; the second conductive layers 753a to 753c; the second conductive layers 763a to 763c; the second conductive layers 773a to 773c; and the second conductive layers 783a to 783c, a highly conductive element or compound, or the like is used. Typically, a single layer or a laminated structure of a single type of element or an alloy including multiple elements of elements selected from the following can be used: gold (Au), silver (Ag), platinum (Pt), nickel (Ni), tungsten (W), chromium (Cr), molybdenum (Mo), iron (Fe), cobalt (Co), copper (Cu), palladium (Pd), carbon (C), aluminum (Al), manganese (Mn), titanium (Ti), tantalum (Ta), and the like. As an alloy including multiple elements mentioned above, for example, an alloy including Al and Ti; an alloy including Al, Ti and C; an alloy including Al and Ni; an alloy including Al and C; an alloy including Al, Ni and C; an alloy including Al and Mo, or the like can be used.

The first conductive layers 751a to 751c; the first conductive layers 761a to 761c; the first conductive layers 771a to 771c; the first conductive layers 781a to 781c; the second conductive layers 753a to 753c; the second conductive layers 763a to 763c; the second conductive layers 773a to 773c; and the second conductive layers 783a to 783c, can be formed using an evaporation method, a sputtering method, a CVD method, a printing method, a dispenser method, or a droplet discharging method.

In this embodiment mode, data writing in a memory cell is carried out by applying an electrical effect or an optical effect. When data writing is carried out by an optical effect, among the first conductive layers 751a to 751c; the first conductive layers 761a to 761c; the first conductive layers 771a to 771c; the first conductive layers 781a to 781c; the second conductive layers 753a to 753c; the second conductive layers 763a to 763c; the second conductive layers 773a to 773c; and the second conductive layers 783a to 783c; either the first conductive layers or the second conductive layers, or both are provided so as to have a light-transmitting property. A conductive layer having a light-transmitting property is formed using a transparent conductive material, or if it is not a transparent conductive material, it is formed with a thickness that allows light to transmit. As the transparent conductive material, oxide conductive materials that have a light-transmitting property such as indium tin oxide (ITO), zinc oxide (ZnO), indium zinc oxide (IZO), gallium added zinc oxide (GZO), and the like can be used. An oxide conductive material that is formed using a target in which 2 to 20 wt % of zinc oxide (ZnO) that is mixed with indium oxide including silicon oxide; indium tin oxide; or indium tin oxide that includes silicon oxide (hereinafter ITSO) may be used.

The insulating layers, which are memory layers, 752, 762, 772, and 782 are formed with an organic insulator, an organic compound which the conductivity changes by an electrical effect or an optical effect, an inorganic insulator, or a layer that is made by mixing an organic compound and an inorganic compound. The insulating layers 752, 762, 772, and 782 may be provided in a single layer or by laminating multiple layers. Also, they may be provided by laminating the mixed layer of an organic compound and an inorganic compound and another layer made of an organic compound which the conductivity changes by an electrical effect or an optical effect.

As an inorganic insulator that can form the insulating layers 752, 762, 772, and 782, silicon oxide, silicon nitride, silicon oxynitride, silicon nitride oxide and the like can be used.

As an organic insulator that can form the insulating layers 752, 762, 772, and 782, an organic resin represented by polyimide, acryl, polyamide, benzocyclobutene, epoxy, and the like can be used.

As an organic compound that can form the insulating layers 752, 762, 772, and 782, which the conductivity changes by an electrical effect or an optical effect, an organic compound material having a high hole-transporting property, or an organic compound material having a high electron-transporting property can be used.

As the organic compound material having a high hole-transporting property, an aromatic amine compound (in other words, having a benzene ring-nitrogen bond) such as 4,4'-bis[N-(1-naphthyl)-N-phenyl-amino]-biphenyl (abbreviated: α-NPD); 4,4'-bis[N-(3-methylphenyl)-N-phenyl-amino]-biphenyl (abbreviated: TPD); 4,4',4"-tris(N,N-diphenyl-amino)-triphenylamine (abbreviated: TDATA); 4,4',4"-tris[N-(3-methylphenyl)-N-phenyl-amino]-triphenylamine (abbreviated: MTDATA); 4,4'-bis(N-(4-(N,N-di-m-tolylamino)phenyl)-N-phenylamino)biphenyl (abbreviated: DNTPD), or a phthalocyanine compound such as phthalocyanine (abbreviated: H$_2$PC), copper phthalocyanine (abbreviated: CuPc), vanadyl phthalocyanine (abbreviated: VOPc) can be used. The substances mentioned here are mainly substances having a hole mobility of $10^{-6}$ cm$^2$/Vs or higher. However, another substance than those mentioned above may be used if the hole-transporting property of the substance is higher than its electron-transporting property.

In a case of providing a mixed layer of an organic compound and an inorganic compound, it is preferable to mix an organic compound material having a high hole-transporting property and an inorganic compound material that easily accepts electrons. With such a structure, a large number of hole carriers are generated in the organic compound which normally has very few carriers internally, and exhibits extremely superior hole injecting and transporting properties. Consequently, the organic compound layer can obtain superior conductivity.

As the inorganic compound material that easily accepts electrons, a metal oxide, a metal nitride, or a metal nitride oxide of the transition metals in group 4 to group 12 of the periodic table, can be used. Specifically, titanium oxide ($TiO_x$), zirconium oxide ($ZrO_x$), vanadium oxide ($VO_x$), molybdenum oxide ($MoO_x$), tungsten oxide ($WO_x$), tantalum oxide ($TaO_x$), hafnium oxidate ($HfO_x$), niobium oxide ($NbO_x$), cobalt oxide ($Co_x$), rhenium oxide ($ReO_x$), ruthenium oxide ($RuO_x$), zinc oxide (ZnO), nickel oxide ($NiO_x$), copper oxide ($CuO_x$) and the like can be used. Even though oxides are given as specific examples, it is needless to say that nitrides and nitride oxides of these metals may be used.

As the organic compound material having a high electron-transporting property, a material made of a metal complex having a quinoline skeleton or a benzoquinoline skeleton such as tris(8-quinolinolato)aluminum (abbreviated: $Alq_3$), tris(4-methyl-8-quinolinolato)aluminum (abbreviated: $Almq_3$), bis(10-hydroxybenzo[h]-quinolinato)beryllium (abbreviated: $BeBq_2$), and bis(2-methyl-8-quinolinolato)-4-phenylphenolato-aluminum (abbreviated: BAlq) can be used. Also, a material such as a metal complex having an oxazole based or a thiazole based ligand such as bis[2-(2-hydroxyphenyl)benzoxazolato]zinc (abbreviated: $Zn(BOX)_2$), and bis[2-(2-hydroxyphenyl)benzothiazolato]zinc (abbreviated: $Zn(BTZ)_2$) can be used. Furthermore, other than a metal complex, 2-(4-biphenylyl)-5-(4-tert-butylphenyl)-1,3,4-oxadiazole (abbreviated: PBD); 1,3-bis[5-(p-tert-butylphenyl)-1,3,4-oxadiazole-2-yl]benzene (abbreviated: OXD-7); 3-(4-tert-butylphenyl)-4-phenyl-5-(4-biphenylyl)-1,2,4-triazole (abbreviated: TAZ); 3-(4-tert-butylphenyl)-4-(4-ethylphenyl)-5-(4-biphenylyl)-1,2,4-triazole (abbreviated: p-EtTAZ); bathophenanthroline (BPhen), bathocuproin (BCP), or the like can be used. The substances mentioned here are mainly substances having an electron mobility of $10^{-6}$ $cm^2/Vs$ or higher. However, other substances than those mentioned above may be used if the electron-transporting property of the substance is higher than its hole-transporting property.

In a case of providing a mixed layer of an organic compound and an inorganic compound, it is preferable to mix an organic compound material having a high electron-transporting property and an inorganic compound material that easily donates electrons. With such a structure, a large number of electron carriers are generated in the organic compound which normally has very few carriers internally, and exhibits extremely superior electron injecting and transporting properties. Consequently, the organic compound layer can obtain superior conductivity.

As the inorganic compound material that easily donates electrons, alkali metal oxide, alkaline earth metal oxide, rare-earth metal oxide, alkali metal nitride, alkali earth metal nitride, and rare-earth metal nitride can be used. Specifically, lithium oxide ($LiO_x$), strontium oxide ($SrO_x$), barium oxide ($BaO_x$), erbium oxide ($ErO_x$), sodium oxide ($NaO_x$), lithium nitride ($LiN_x$), magnesium nitride ($MgN_x$), calcium nitride, yttrium nitride ($YN_x$), lanthanum nitride ($LaN_x$), and the like can be used.

Furthermore, the inorganic compound material may be anything as long as it is an inorganic compound material that easily accepts electrons from an organic compound, or an inorganic compound material that easily donates electrons to an organic compound. In addition to aluminum oxide ($AlO_x$), gallium oxide, ($GaO_x$), silicon oxide ($SiO_x$), germanium oxide ($GeO_x$), indium tin oxide (ITO) and the like, various metal oxides, metal nitrides, or metal nitride oxides can be used.

Also, when the insulating layers 752, 762, 772, and 782 are formed of a compound selected from metal oxides or metal nitrides, and a compound having a high hole-transporting property, the structure may be added with a compound of an even larger steric barrier (a compound having a structure that expands three-dimensionally unlike one having a planar structure). As a compound of a large steric barrier, 5, 6, 11, 12-tetraphenyl tetracene (abbreviated: rubrene) is preferable. However, hexaphenylbenzene, t-butylperylene, 9,10-di(phenyl)anthracene, coumarin 545T, or the like can be used alternatively. Further, a dendrimer or the like is also effective.

Furthermore, a light-emitting substance such as 4-dicyanomethylene-2-methyl-6-(1,1,7,7-tetramethyl julolidyl-9-enyl)-4H-pyran (abbreviation: DCJT); 4-dicyanomethylene-2-t-butyl-6-(1,1,7,7-tetramethyljulolidyl-9-enyl)-4H-pyran; periflanthene; 2,5-dicyano-1,4-bis(10-methoxy-1,1,7,7-tetramethyljulolidyl-9-enyl)benzene; N,N'-dimethyl quinacridone (abbreviation: DMQd); coumarin 6; coumarin 545T; tris(8-quinolinolato)aluminum (abbreviation: $Alq_3$); 9,9'-bianthryl, 9,10-diphenylanthracene (abbreviation: DPA); 9,10-bis(2-naphthyl)anthracene (abbreviation: DNA); 2,5,8,11-tetra-t-butylperylene (abbreviated: TBP) or the like may be provided between a layer that is formed with the organic compound material having a high electron-transporting property, and an organic compound material layer having a high hole-transporting property.

For the insulating layers 752, 762, 772, and 782, a material which the electrical resistance changes by an optical effect can be used. For example, a conjugate high molecular weight material doped with a compound, which generates acid by absorbing light (photoacid generator), can be used. As a conjugate high molecular weight material, polyacetylenes, polyphenylenevinylenes, polythiophenes, polyanilines, polyphenylene ethynylenes, or the like can be used. Also, as a photoacid generator, aryl sulfonium salt, aryl iodonium salt, o-nitrobenzyl tosylate, aryl sulfonic acid p-nitrobenzylester, sulfonyl acetophenones, Fe-arene complex $PF_6$, or the like can be used.

The insulating layers 752, 762, 772 and 782 can be formed using an evaporation method, an electronic beam evaporation method, a sputtering method, a CVD method, or the like. A mixed layer including the organic compound and the inorganic compound can be formed by depositing each of the materials simultaneously. It can be formed by combining the same method or different kinds of methods, such as co-evaporation by resistance heating evaporation, co-evaporation by electronic beam evaporation, co-evaporation by resistance heating evaporation and electronic beam evaporation, deposition by resistance heating evaporation and sputtering, deposition by electronic beam evaporation and sputtering, or the like.

Note that the insulating layers 752, 762, 772, and 782 are formed with a film thickness so that the conductivity of the memory element changes by an electrical effect or an optical effect.

As partitions (insulating layers) 755, 765, 775, and 785, an inorganic insulating material such as silicon oxide, silicon nitride, silicon oxynitride, aluminum oxide, aluminum nitride, or aluminum oxynitride; acrylic acid, methacrylic acid, or a derivative thereof; a heat-resistant high molecular weight material such as polyimide, aromatic polyamide, or polybenzimidazole; or a siloxane material may be used. Note that the siloxane material corresponds to a resin including a Si—O—Si bond. The skeletal structure of siloxane is structured by a bond between silicon (Si) and oxygen (O). As a substituent group, an organic group including at least hydrogen (for example, an alkyl group or an aromatic hydrocarbon) is used. As the substituent group, a fluoro group may also be used. Further, an organic group including at least hydrogen, and an fluoro group may be used as the substituent group. Furthermore, a vinyl resin such as polyvinyl alcohol, or polyvinyl butyral; or a resin material such as epoxy resin, phenol resin, novolac resin, acrylic resin, melamine resin, or urethane resin is used. Also, an organic material such as benzocyclobutene, parylene, or polyimide; a polymer and the like in which a compound is made by polymerization; or a composition material including a water-soluble homopolymer and a water-soluble copolymer may be used. As a preparation method, a vapor growth method such as a plasma CVD method or a thermal CVD method, or a sputtering method can be used. Further, a droplet discharging method, a dispenser method, or a printing method (a method in which a pattern is formed, such as screen printing or offset printing) can also be used. A thin film and the like obtained by a spin coating method can also be used.

After forming a conductive layer, an insulating layer, or the like by discharging a composition, the surface may be pressed with pressure to be planarized, in order to increase planarity. As a method for pressing, asperity can be reduced by scanning a roller-shaped object on the surface, or the surface may be pressed perpendicularly with a flat, plate-like object. At the time of pressing, a heating step may be carried out. Also, the surface may be softened or dissolved by a fluxing material, and the asperity portion of the surface may be removed with an air knife. Further, it may be polished using a CMP method. This process can be applied when an asperity occurs as a result of a droplet discharging method, and when the surface is to be planarized.

Also, in this embodiment mode, for the above described structure, an element having a rectifying property may be provided between the first conductive layers 751a to 751c, the first conductive layers 761a to 761c, the first conductive layers 771a to 771c, the first conductive layers 781a to 781c; and, the insulating layer 752, the insulating layer 762, the insulating layer 772, and insulating layer 782, respectively. The element having a rectifying property is a transistor which a gate electrode and a drain electrode are connected, or a diode. In this manner, by providing the diode having a rectifying property, error is reduced since current only flows in one direction, and a readout margin improves. Note that the element having a rectifying property may be provided between the insulating layer 752, the insulating layer 762, the insulating layer 772, the insulating layer 782; and, the second conductive layers 753a to 753c, the second conductive layers 763a to 763c, the second conductive layers 773a to 773c, and the second conductive layers 783a to 783c, respectively.

By the memory element of the present invention, driving voltage during data writing can be lowered. As a result, a memory device and a semiconductor device with low power consumption can be provided at low cost.

Embodiment Mode 2

In this embodiment mode, a memory device having a structure different from that of the above embodiment mode 1 is described. Specifically, a case where the structure of a memory device is an active matrix type is described.

Figure 5:
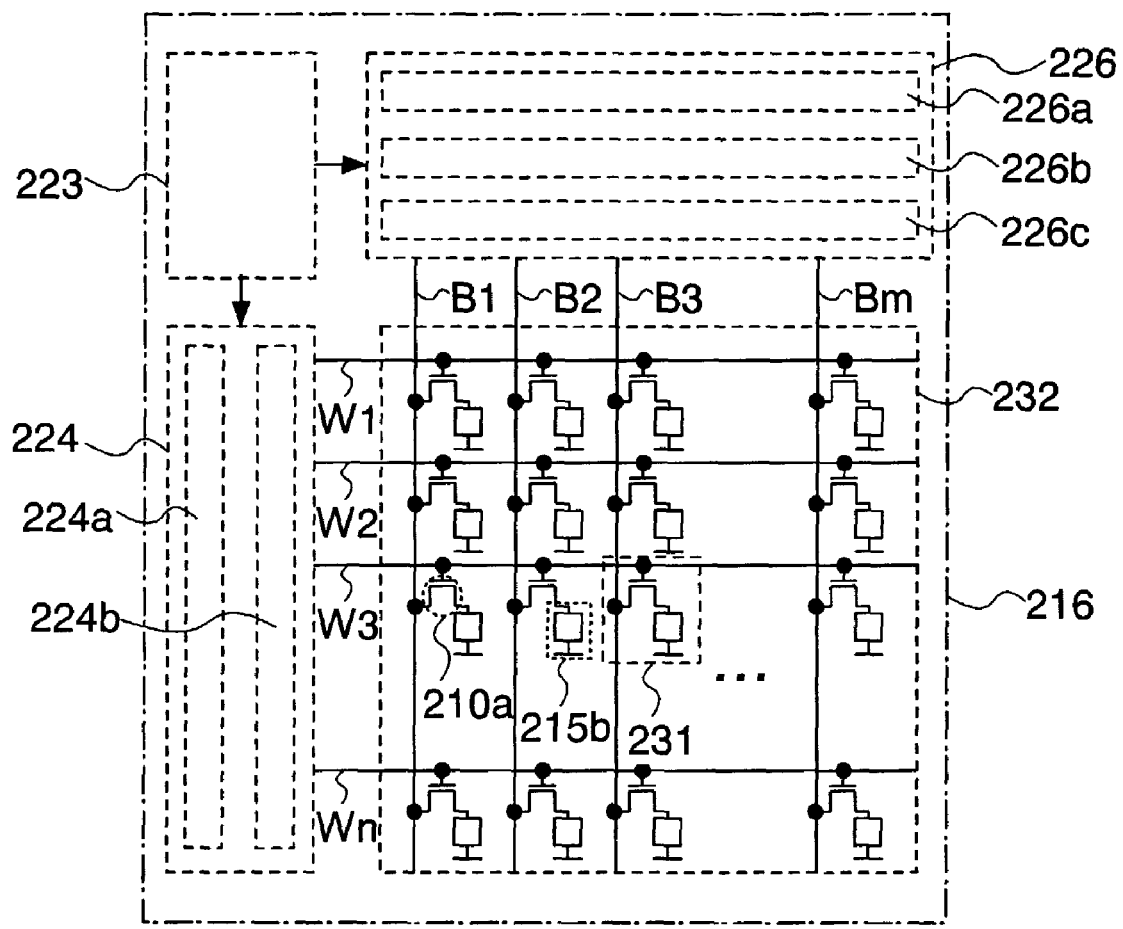
FIG. 5 describes a memory device of the present invention.

FIG. 5 shows an example of a structure of the memory device that is described in this embodiment mode, which includes a memory cell array 232 in which memory cells 231 are provided in a matrix form; a bit line driving circuit 226 that has a column decoder 226a, a readout circuit 226b, and a selector 226c; a word line driving circuit 224 that has a row decoder 224a and a level shifter 224b; and an interface 223 which carries out interactions with the exterior and has a writing circuit and the like. Note that the structure of a memory device 216 shown here is only one example, and it may include another circuit such as a sense amplifier, an output circuit, or a buffer, and the writing circuit may be provided in the bit line driving circuit.

A single memory cell 231 has first wirings that structure word lines Wy ($1 \leq y \leq n$), second wirings that structure bit lines Bx ($1 \leq y \leq m$), a transistor 210a, and a memory element 215b. The memory element 215b has a structure in which an insulating layer is interposed between a pair of conductive layers.

Figure 4A:
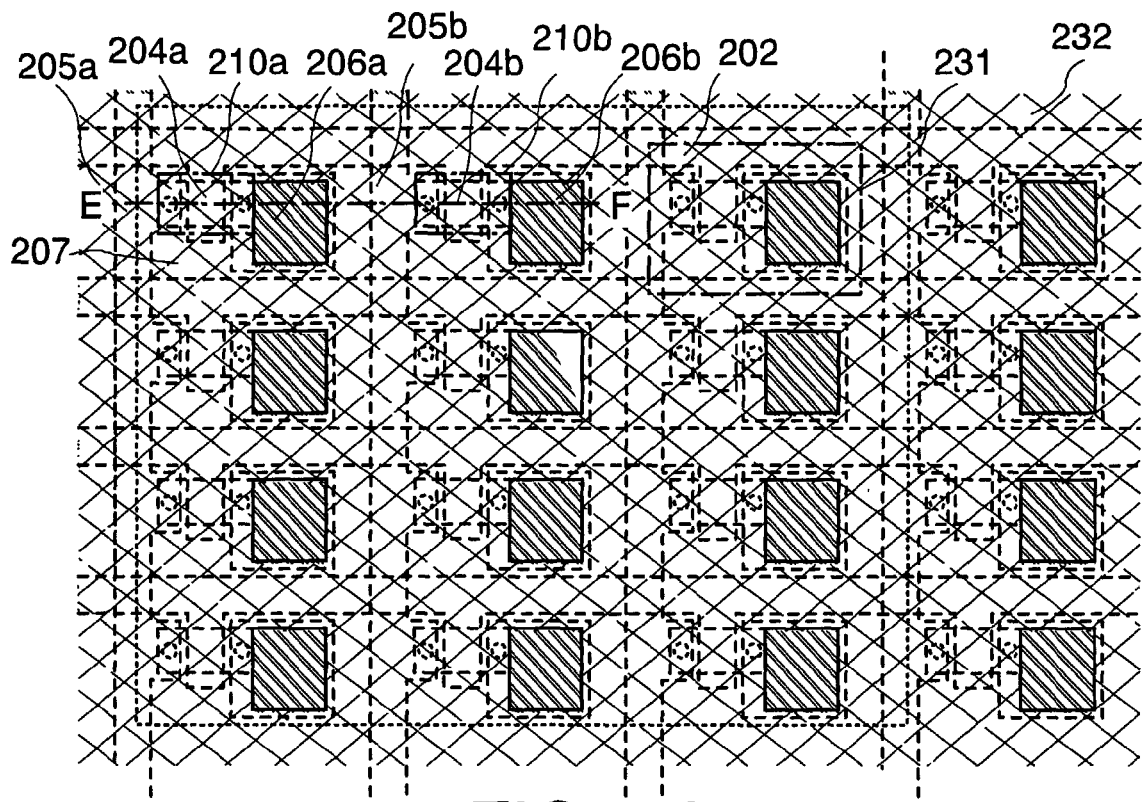
FIGS. 4A and 4B describe a memory device of the present invention.
Figure 4B:
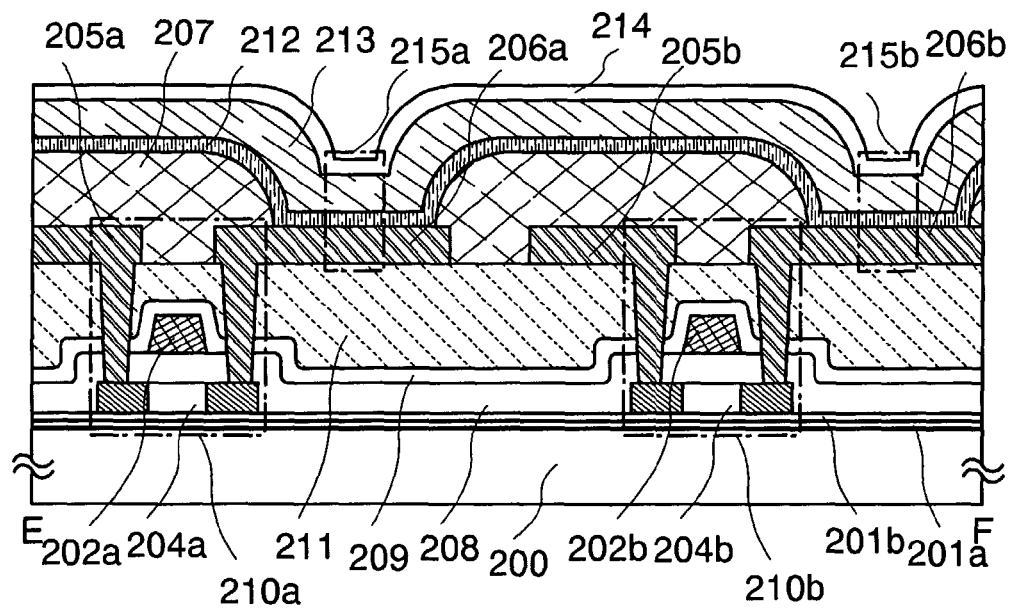

A top view of the memory cell array 232 is shown in FIG. 4A, and a cross-sectional view of the figure in FIG. 4A along the line E-F is shown in FIG. 4B. Also, an insulating layer 212 and an insulating layer 214 are omitted and not shown in FIG. 4A, but they are each provided as shown in FIG. 4B.

For the memory cell array 232, first wirings 205a and 205b which extend in a first direction, and a second wiring 202 which extends in a second direction that is perpendicular to the first direction, are provided in a matrix form. Also, the first wirings are connected to source or drain electrodes of the transistor 210a and a transistor 210b, and the second wiring is connected to gate electrodes of the transistors 210a and 210b first conductive layers 206a and 206b are connected to source or drain electrodes of the transistors 210a and 210b that are not connected to the first wirings. Further, a memory element 215a, and a memory element 215b are provided, and the structure is that of stacking an insulating layer 212 and a second conductive layer 213 over a first conductive layers 206a and 206b. Partitions (insulating layers) 207 are provided between each of the memory cells 231, which are adjacent to each other, and an insulating layer 212 and a second conductive layer 213 are stacked and provided over the first conductive layers and the partitions (insulating layers) 207. The insulating layer 214 is provided over the second conductive layer 213 as a protective layer. Also, as the transistors 210a and 210b, thin film transistors are used (refer to FIGS. 4A and 4B). A memory device in FIG. 4B is provided over a substrate 200 and has insulating layers 201a, 201b, 208, 209, and 211; a semiconductor layer 204a which structures the transistor 210a; a gate electrode layer 202a; the first wiring 205a which is also a source electrode layer or a drain electrode layer; a semiconductor layer 204b which structures the transistor 210b; and a gate electrode layer 202b.

In this embodiment mode, the insulating layer 212 is formed so as to be in contact with the first conductive layer 206a and the partitions (insulating layers) 207 covering the end portions of the first conductive layers. When voltage is applied between the first conductive layer 206a and the second conductive layer 213, current flows through the insulating layer 212, and heat such as Joule heat is generated. Also in this embodiment mode, when the temperature of the insulating layer 212 rises to its glass-transition temperature and turns into a fluid composition, the wettability of the partitions (insulating layers) 207 surfaces against the fluid composition is higher than that of the first conductive layer 206a surface.

The fluid composition moves in the direction where there is higher wettability, so the fluid composition flows without maintaining a form during it was solid towards the partitions (insulating layers) 207 which has high wettability. Consequently, the thickness of the insulating layer becomes uneven and the insulating layer changes shape, and the first conductive layer 206 and the second conductive layer 213 are short-circuited. Furthermore, there is also a case in which an electric field is concentrated in a region where the insulating layer is thin, and a dielectric breakdown occurs, which short-circuits the first and second conductive layers. Consequently, the conductivity of the memory element is different before and after voltage application. The same applies to the memory element 215b, which includes the first conductive layer 206b, the partition (insulating layer) 207, the insulating layer 212, and the second conductive layer 213; as to the memory element 215a.

As a result, writing can be carried out with low power consumption.

Figure 6:
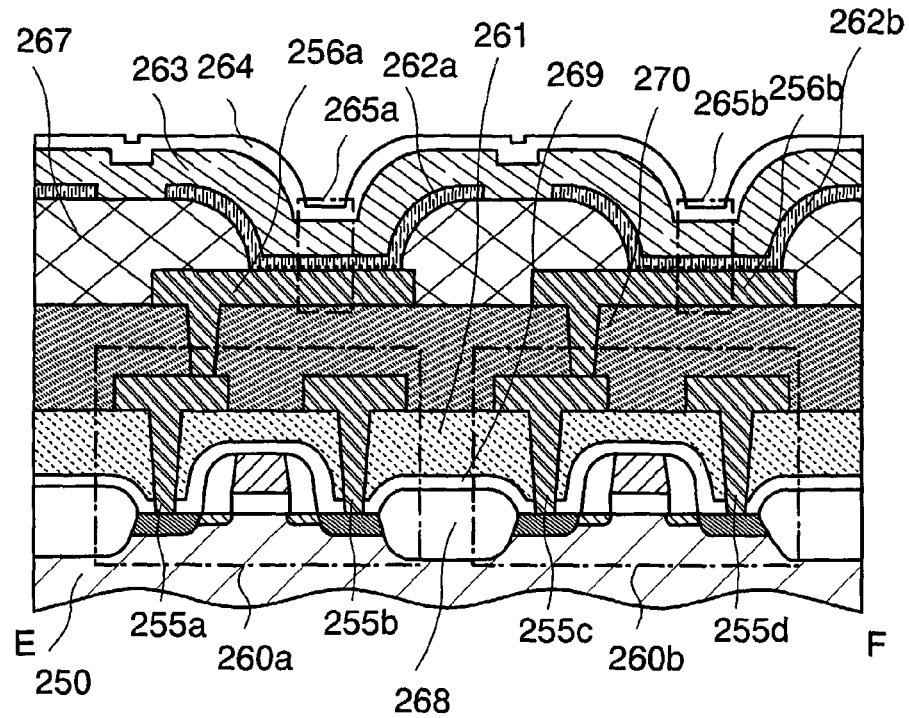
FIG. 6 describes a memory device of the present invention.

Also, as shown in FIG. 6, memory elements 265a and 265b may be connected to field effect transistors 260a and 260b respectively, that are provided over a single crystal semiconductor substrate 250. Here, the memory elements 265a and 265b are structured such that insulating layers 270 are provided so as to cover source electrode layers or drain electrode layers 255a to 255d of the field effect transistors 260a and 260b at least partly, and over the insulating layers 270, a first conductive layer 256a, a first conductive layer 256b, partitions (insulating layers) 267, insulating layers 262a, and 262b, and a second conductive layer 263 are provided. Like the insulating layers 262a and 262b, an insulating layer may be selectively provided only for an individual memory cell, using a mask or the like. Further, a memory device shown in FIG. 6 also has an element isolation region 268, insulating layers 269, 261, and 264.

In the memory elements 265a and 265b, the surfaces of the first conductive layer 256a and the first conductive layer 256b are controlled so as to be liquid repellant regions, by a plasma treatment using a gas including fluorine as shown by dotted lines. Therefore, the surfaces of the first conductive layer 256a and the first conductive layer 256b have lower wettability against a fluid composition of a material forming the insulating layers 262a and 262b, than the surfaces of the partitions (insulating layers) 267. Consequently, the fluid composition of a material forming the insulating layers 262a and 262b moves in the direction of the partitions (insulating layers) 267 when the insulating material is fluidized, and the memory elements 265a and 265b are easy to be short-circuited.

In this manner, by forming the memory elements by providing the insulating layers 270, the first conductive layers can be freely arranged. In other words, in the structure in FIG. 4B, it was necessary to provide the memory elements 215a and 215b in regions that avoid the transistors 210a and 210b; however, by the above structure, the memory element 215a and the memory element 215b can be formed over the transistor 210a and transistor 210b, for example. As a result, higher integration of the memory device 216 becomes possible.

Further, if the transistors 210a and 210b can function as switching elements, they may be provided with any type of structure. Also, various semiconductors can be used for the semiconductor layer such as an amorphous semiconductor, a crystalline semiconductor, a polycrystalline semiconductor, and a microcrystalline semiconductor, and an organic transistor using an organic compound may be formed. Although an example of providing a thin film transistor of a planar type over a substrate having an insulating property is shown in FIG. 4A, the transistor can be formed to have a staggered type or an inversely staggered type structure.

Figure 7:
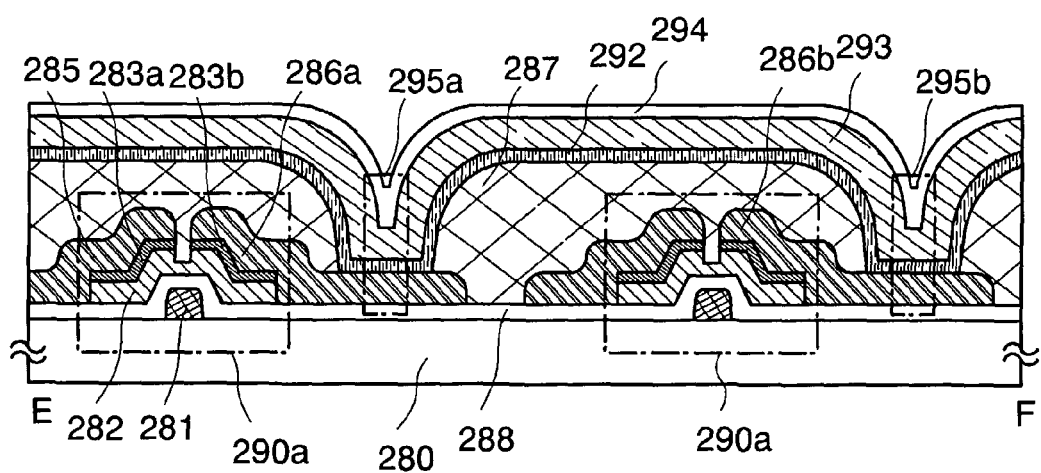
FIG. 7 describes a memory device of the present invention.

In FIG. 7, an example of using a thin film transistor with a inversely staggered type structure is shown. Over a substrate 280, a transistor 290a and a transistor 290b that are thin film transistors of a inversely staggered type structure, are provided. The transistor 290a has an insulating layer 288, a gate electrode layer 281, an amorphous semiconductor layer 282, a semiconductor layer of one conductivity type 283a and 283b, and a source electrode layer or a drain electrode layer 285; and a source or drain electrode layer is a first conductive layer 286a which structures a memory element. Memory elements 295a and 295b are structured by stacking a partitions (insulating layers) 287 so as to cover the end portions of the first conductive layers 286a and 286b, then forming an insulating layer 292, a second conductive layer 293, and an insulating layer 294 which is a protective layer, over the first conductive layer 286a, the first conductive layer 286b, and the partitions (insulating layers) 287. As for a memory device shown in FIG. 7, the gate electrode layer 281, the source electrode layer or the drain electrode layer 285, the first conductive layer 286a, the first conductive layer 286b, and the partitions (insulating layers) 287 are formed using a droplet discharging method. The droplet discharging method is a method in which a composition including a component forming material that is fluid is discharged (jetted) as a droplet to form a desired pattern. A droplet containing a component forming material is discharged to a formation region of a component and is solidified by baking and drying, etc. to form a component in a desired pattern.

Also, any kind of structure may be used for the semiconductor layer that is included in the transistor, for example, an impurity region (including a source region, a drain region, and an LDD region) may be formed, or the transistor may be formed either as a p-channel type or as an n-channel type. Furthermore, an insulating layer (sidewall) may be formed so as to be in contact with a side surface of a gate electrode, and a silicide layer may be formed for either or both a gate electrode and source and drain regions. As a material for the silicide layer, nickel, tungsten, molybdenum, cobalt, platinum or the like can be used.

For the first conductive layers 206a, 206b, 256a, 256b, 286a, and 286b; and the second conductive layers 213, 263, and 293 shown in this embodiment mode, any of the materials and formation methods shown in the above embodiment mode 1 can be used and carried out in the same manner.

Also, the insulating layers 212, 262a, 262b, and 292 can be provided by using the same material and formation method as for the insulating layer 752 shown in the above embodiment mode 1.

An element having a rectifying property may be provided between the first conductive layers 206a, 206b, 256a, 256b, 286a, and 286b; and the insulating layers 212, 262a, 262b, and 292. The element having a rectifying property is a diode or a transistor in which a gate electrode and a drain electrode are connected to each other. For example, a PN junction diode that is provided by stacking an N-type semiconductor layer and a P-type semiconductor layer can be used. In this manner, by providing a diode having a rectifying property, error is reduced since current only flows in one direction, and the readout margin improves. Note that when a diode is provided, a diode of a different structure such as a diode having a PIN junction or an avalanche diode may be used instead of the diode having a PN junction. The element having a rectifying property may be provided between the insulating layers 212, 262a, 262b, and 292; and the second conductive layers 213, 263, and 293.

By the memory element of the present invention, driving voltage during data writing can be lowered. As a result, a memory device and a semiconductor device with low power consumption can be provided at low cost.

Embodiment Mode 3

In this embodiment mode, one example of a semiconductor device having the memory device shown in the above mentioned embodiment mode, will be described with reference to drawings.

A characteristic of the semiconductor device shown in this embodiment mode is that data readout and writing are possible without contact. Data transmission methods are classified broadly into three, and any of the following may be used: an electromagnetic coupling method of communicating by mutual induction with a pair of coils placed opposite of each other; an electromagnetic induction method of communicating by an inductive electromagnetic field; or an electric wave method of communicating by using electric waves. Also, an antenna that is used for transmitting data can be provided in two ways. One way is to provide the antenna over a substrate over which a plurality of elements and memory elements are formed; and the other way is to provide a terminal portion for a substrate over which a plurality of elements and memory elements are formed, to connect an antenna that is provided over another substrate to the terminal portion.

First, one example of a structure of a semiconductor device in which an antenna is provided over a substrate which a plurality of elements and memory elements are provided over, is explained with reference to FIG. 10.

Figure 10:
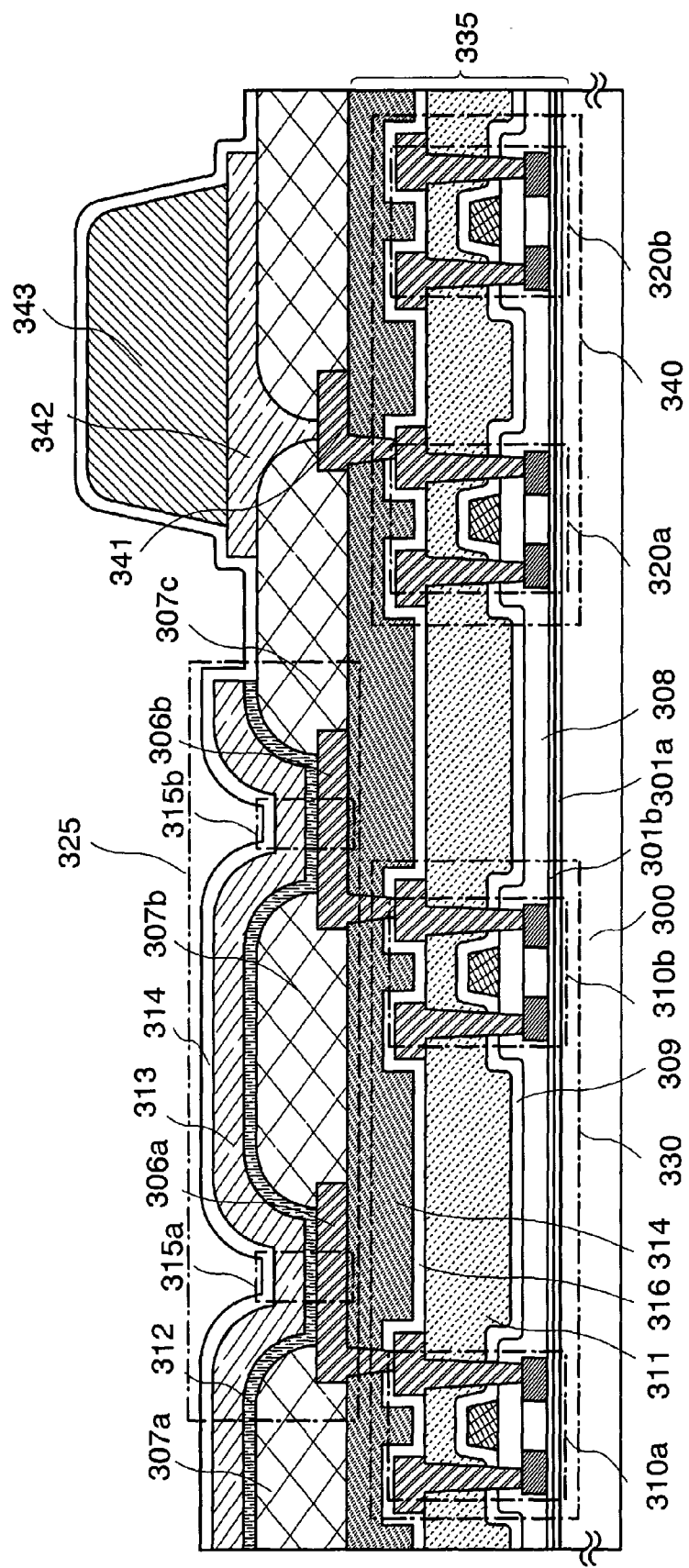
FIG. 10 describes a semiconductor device of the present invention.

FIG. 10 shows a semiconductor device which has a memory device that is structured as an active matrix type, in which an element formation layer 335 including a transistor portion 330 having transistors 310a and 310b; a transistor portion 340 having transistors 320a and 320b; and insulating layers 301a, 301b, 308, 311, 316, and 314, are provided over a substrate 300. Furthermore, a memory element portion 325, and a conductive layer 343 that functions as an antenna are provided over the element formation layer 335.

Note that, although the case shown here is that of providing the conductive layer 343 that functions as the antenna and the memory element portion 325 over the element formation layer 335, a structure is not limited thereto, and the conductive layer 343 that functions as the antenna and the memory element portion 325 can be provided in the same layer as the element formation layer 335 or below it.

The memory element portion 325 is structured by memory elements 315a and 315b. The memory element 315a is structured by stacking partitions (insulating layers) 307a and 307b, an insulating layer 312 and a second conductive layer 313 over a first conductive layer 306a; and the memory element 315b is provided by stacking the partitions (insulating layers) 307b and 307c, the insulating layer 312 and the second conductive layer 313 over a first conductive layer 306b. Also, an insulating layer 314 that functions as a protective film is formed so as to cover the second conductive layer 313. Further, the first conductive layers 306a and 306b with which the multiple memory elements 315a and 315b are formed, are electrically connected to source or drain electrode layers of the transistor 310a and transistor 310b, respectively. In other words, each memory element is electrically connected to a transistor. Furthermore, although here, the insulating layer 312 is formed over the entire surface so as to cover the first conductive layers 306a and 306b; and the partitions (insulating layers) 307a, 307b, and 307c, it may be selectively formed for each memory cell. Note that the memory elements 315a and 315b can be formed by using the material or the manufacturing method shown in the above embodiment modes.

For the memory elements 315a and 315b, the wettability of the surfaces of the first conductive layers 306a and 306b against a fluid composition of a material forming the insulating layer 312, is lower than that of the surfaces of the partitions (insulating layers) 307a, 307b, and 307c. Consequently, the fluid composition of a material forming the insulating layer 312 moves towards the partitions (insulating layers) 307a when the insulating material is fluidized, 307b, and 307c, and the memory elements 315a and 315b are easy to be short-circuited.

Also, in the memory element 315a, an element having a rectifying property may be provided between the first conductive layer 306a and the insulating layer 312, or between the insulating layer 312 and the second conductive layer 313, as shown in the above embodiment modes. As the element having a rectifying property, one mentioned above can be used. Note that the same applies to the memory element 315b.

Here, the conductive layer 343 that functions as the antenna is provided above a conductive layer 341, which is formed with the same layer as the first conductive layer 306a and 306b a conductive layer 342, which is formed with the same layer as the second conductive layer 313. Note that the conductive layer that functions as the antenna may be formed with the same layer as the second conductive layer 313.

As a material for the conductive layer 343 that functions as the antenna, a single element selected from gold (Au), platinum (Pt), nickel (Ni), tungsten (W), molybdenum (Mo), cobalt (Co), copper (Cu), aluminum (Al), manganese (Mn), titanium (Ti), and the like, an alloy containing a plurality of these elements or the like can be used. Also, for a formation method of the conductive layer 343 that functions as the antenna, evaporation, sputtering, a CVD method, a dispenser method, various printing methods such as screen printing or gravure printing, a droplet discharging method, or the like can be used.

Each of the transistors 310a, 310b, 320a and 320b that are included in the element formation layer 335, can be provided as a p-channel type TFT or an n-channel type TFT. Also, any type of structure may be used for a semiconductor layer that is included in the transistors 310a, 310b, 320a, and 320b. For example, an impurity region (including a source region, a drain region, and an LDD region) may be formed, or a p-channel type or an n-channel type may be formed. Furthermore, an insulating layer (sidewall) may be formed so as to be in contact with a side surface of a gate electrode, and a silicide layer may be formed for either or both a gate electrode and source and drain regions. As a material for the silicide layer, nickel, tungsten, molybdenum, cobalt, platinum or the like can be used.

Also, the transistors 310a, 310b, 320a, and 320b that are included in the element forming layer 335 may be provided as organic transistors, in which semiconductor layers that structure the transistors are formed with an organic compound. In this case, the element formation layer 335 including the organic transistor can be formed using a printing method, a droplet discharging method or the like, directly over the substrate 300 which is made of a substrate having a flexible property such as plastic. Formation by using a printing method, a droplet discharging method or like can manufacture a semiconductor device at lower cost.

The element formation layer 335, the memory elements 315a and 315b, and the conductive layer 343 that functions as the antenna can be formed using an evaporation method, a sputtering method, a CVD method, a printing method, a dispenser method, a droplet discharging method, or the like, as mentioned above. Note that it is acceptable to use different methods in different locations. For example, a transistor for which high speed operation is needed can be provided by forming a semiconductor layer that is made of Si or the like and then crystallizing it by a thermal treatment; subsequently, a transistor that functions as a switching element can be provided as an organic transistor using a printing method or a droplet discharging method, over an element formation layer.

Note that a sensor that connects to the transistor may be provided. As the sensor, an element that detects temperature, humidity, illuminance, gas, gravity, pressure, sound vibration, acceleration, and other characteristics by physical or chemical means can be given. The sensor is typically formed by semiconductor elements such as a resistance element, a capacitive coupling element, an inductive coupling element, a photovoltaic element, a photoelectric conversion element, a thermo-electromotive force element, a transistor, a thermistor, or a diode.

Next, an example of a structure of a semiconductor device of providing a terminal portion for a substrate over which a plurality of elements and memory elements are provided, and connecting an antenna that is provided over another substrate to the terminal portion will be explained with reference to FIG. 11.

Figure 11:
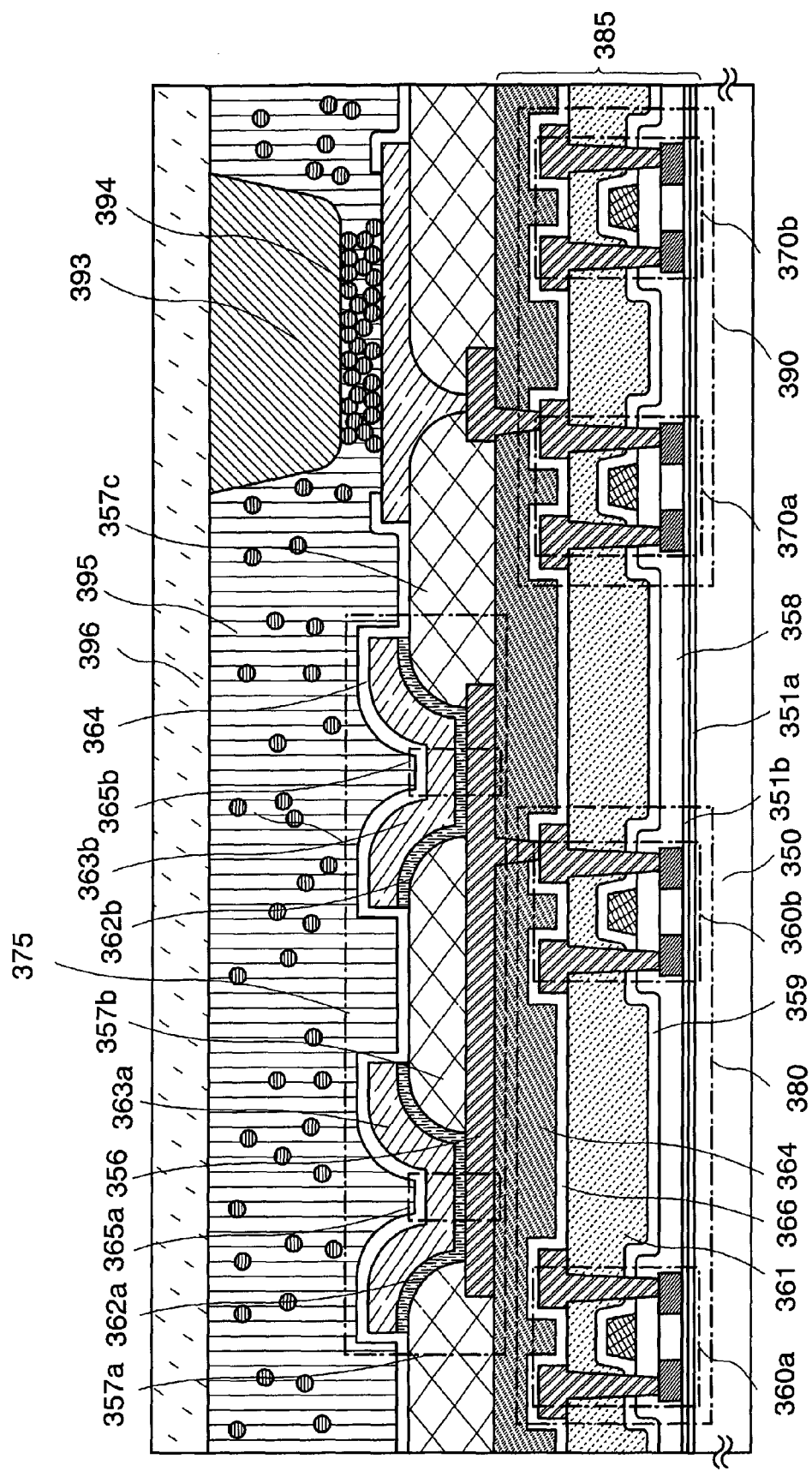
FIG. 11 describes a semiconductor device of the present invention.

FIG. 11 shows a semiconductor device that has a memory device of a passive matrix type, in which an element formation layer 385 is provided over a substrate 350, a memory element portion 375 is provided over the element formation layer 385, and a conductive layer 393 that functions as an antenna is provided adjacent to a substrate 396 so as to be electrically connected to the element formation layer 385 through conductive layers 391 and 392. Note that although what is shown here is a case where the memory element portion 375 or the conductive layer 393 that functions as the antenna is provided over the element formation layer 385, it is not limited to this structure, and the memory element portion 375 can be provided in the same layer as the element formation layer 385 or below it, or the conductive layer 393 that functions as the antenna can be provided below the element formation layer 385.

In FIG. 11, the element formation layer 385, which includes a transistor portion 380 having transistors 360a and 360b; a transistor portion 390 having transistors 370a and 370b; insulating layers 351a, 351b, 358, 361, 366, and 364, is provided over the substrate 350.

The memory element portion 375 is structured by memory elements 365a and 365b. The memory element 365a is structured by stacking partitions (insulating layers) 357a and 357b, an insulating layer 362a, and a second conductive layer 363a over a first conductive layer 356; and the memory element 365b is structured by stacking the partition (insulating layer) 357b, a partition (insulating layer) 357c, an insulating layer 362b and a second conductive layer 363b over the first conductive layer 356. Also, an insulating layer 364 that functions as a protective film is formed so as to cover the second conductive layers 363a and 363b. Furthermore, the first conductive layer 356 with which multiple memory elements 365a and 365b are formed, is connected to a source electrode layer or a drain electrode layer of the single transistor 360b. In other words, multiple memory elements are connected to one and the same transistor. Also, for the insulating layers 362a and 362b, the partitions (insulating layers) 357a, 357b, and 357c are provided to separate the insulating layers for each memory cell; however, if there is no concern for an influence of an electric field in the lateral direction between adjacent memory cells, an insulating layer may be formed over the entire surface. Note that the memory elements 365a and 365b can be formed using the material or the manufacturing method shown in the above embodiment modes.

In the memory elements 365a and 365b, the wettability of the surface of the first conductive layer 356 against a fluid composition of a material forming the insulating layers 362a and 362b is lower than that of the surfaces of the partitions (insulating layers) 357a, 357b, and 357c. Consequently, the fluid composition of a material forming the insulating layers 362a and 362b moves in the direction of the partitions (insulating layers) 357a, 357b, and 357c when the insulating material is fluidized, and the memory elements 365a and 365b are easy to be short-circuited.

A substrate provided with the element formation layer 385 and the memory element portion 375, and the substrate 396 provided with the conductive layer 393 that functions as the antenna, are affixed together with a resin 395 that has an adhesion property. The element formation layer 385 and the conductive layer 393 are electrically connected by conductive fine particles 394 that are included within the resin 395. Also, a conductive adhesive agent such as a silver paste, a copper paste, or a carbon paste, or a method of carrying out a solder joint may be used to affix together the substrate including the element formation layer 385 and the memory element portion 375, and the substrate 396 for which the conductive layer 393 that functions as the antenna is provided.

In this manner, a semiconductor device that is equipped with the memory device and the antenna can be formed. In this embodiment mode, the element formation layer can be provided also by forming a thin film transistor over the substrate, or the element formation layer may also be provided by using a semiconductor substrate of Si or the like as a substrate, and forming a field effect transistor over the substrate. Furthermore, using an SOI substrate as a substrate, the element formation layer may be provided thereover. In this case, the SOI substrate may be formed by using a method of affixing together wafers, or a method called SIMOX in which an insulating layer is internally formed by implanting oxygen ions into a Si substrate.

Furthermore, the substrate that is provided with the conductive layer which functions as the antenna, may be provided with the memory element portion. Also, a sensor that is connected to the transistor may be provided.

Note that this embodiment mode can be freely combined and carried out with the above embodiment modes. Also, the semiconductor device that is manufactured in this embodiment mode can be provided over a flexible substrate by peeling it off from the substrate through a peeling process and sticking it to a flexible substrate, and a semiconductor device having a flexible property can be obtained. The flexible substrate corresponds to a film made of polypropylene, polyester, vinyl, polyvinyl fluoride, vinyl chloride, or the like; paper made of a fibrous material; a laminated film of a base film (such as polyester, polyamide, an inorganic evaporation film, or paper), an adhesive synthetic resin film (acrylic synthetic resin, epoxy synthetic resin, or the like), and the like. Thermocompression is to be carried out on the film with a treatment object, by a heating treatment and a pressure treatment. When the heating treatment and the pressure treatment are carried out, an adhesion layer that is provided on the outermost surface of the film, or a layer that is provided as the outermost layer (not the adhesion layer) is melted by a heating treatment, then it is attached by applying pressure. Also, the adhesion layer either may or may not be provided on a base. The adhesion layer corresponds to a layer that contains adhesive agents such as a thermal setting resin, an ultraviolet curable resin, an epoxy resin, or a resin additive.

By the memory element of the present invention, driving voltage during data writing can be lowered. As a result, a memory device and a semiconductor device with low power consumption can be provided at low cost.

Embodiment Mode 4

In this embodiment mode, data reading and writing in a semiconductor device having the above structure will be explained.

Data writing into the semiconductor device having the above structure can be carried out by applying an optical effect or an electrical effect. A case where data writing is carried out by applying an electrical effect will be explained first (refer to FIG. 3).

When data writing is carried out by applying an electrical effect, one memory cell 721 is selected by a row decoder 724a, a column decoder 726a, and a selector 726c, and data is written thereafter in the memory cell 721 using a writing circuit. Specifically, a high voltage is selectively applied to the insulating layer 752 of a desired portion, so a high current flows through, and a short circuit between the first conductive layer 751b and the second conductive layer 753b is caused.

The electrical resistance of the short-circuited portion is significantly lower compared to other portions. In this manner, by utilizing the change in electrical resistance between two conductive layers caused by applying an electrical effect, data writing is carried out. For example, when an insulating layer to which an electrical effect is not applied is data "0", and when data "1" is to be written, electrical resistance is made lower through short-circuiting, by selectively applying high voltage to a desired portion of the insulating layer so that a large current flows through.

Figure 8A:
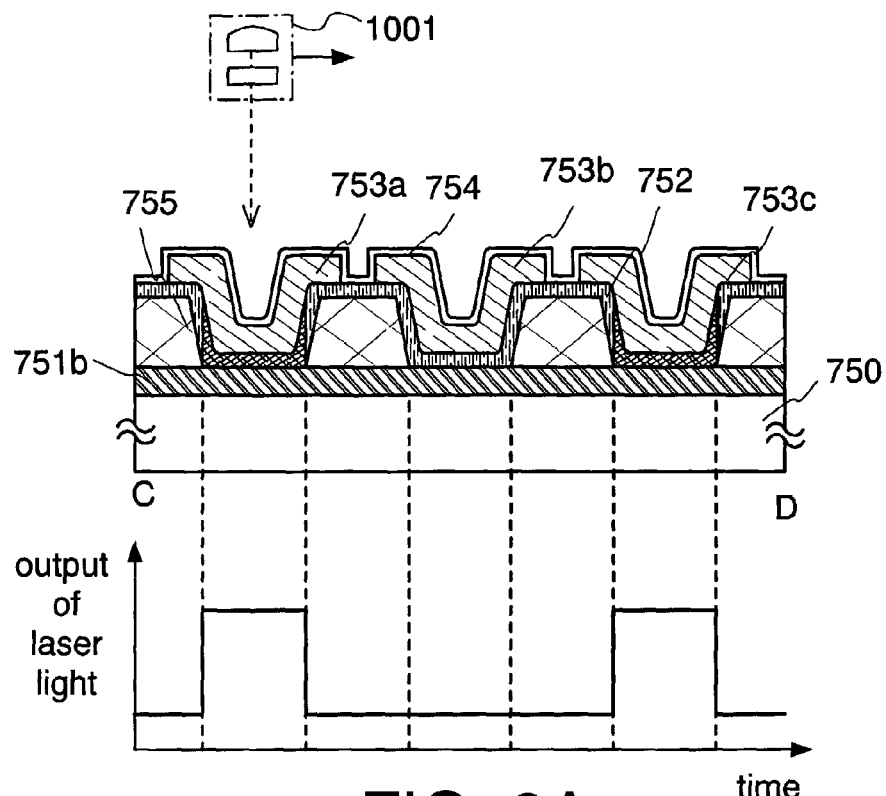
FIG. 8A describes a memory device, and FIG. 8B describes a laser apparatus system of the present invention.
Figure 8B:
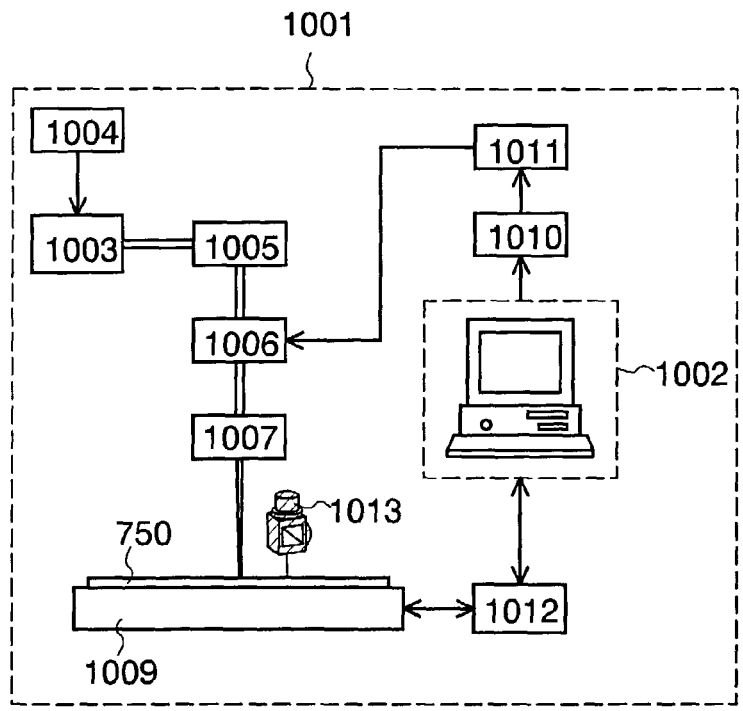

A case where data writing is carried out by applying an optical effect will be explained next (refer to FIGS. 8A and 8B).

When data writing is carried out by applying an optical effect, the insulating layer 752 is irradiated with laser light from a conductive layer side having a light-transmitting property (here, the second conductive layer 753a). Here, a desired portion of the insulating layer 752 is selectively irradiated with laser light, and the insulating layer 752 is broken down. Because the broken-down insulating layer becomes more insulating due to carbonization, electrical resistance thereof becomes significantly higher compared to other portions. In this manner, data writing is carried out by utilizing the change in electrical resistance of the insulating layer 752 through laser light irradiation. For example, when an insulating layer that is not irradiated with laser light is data "0", and when data "1" is to be written, electrical resistance is made higher by selectively irradiating a desired portion of the insulating layer with laser light and breaking it down.

Since writing may be carried out as long as the resistance value of a memory element is changed before and after writing, the change in the resistance value of the memory element may be caused in any way by an optical effect or an electrical effect. For example, with energy from light irradiation (such as heat), a first conductive layer and a second conductive layer in a memory element may become close to each other by a form change of the first conductive layer or the second conductive layer, and consequently an insulating layer may change shape.

In a case of irradiation with laser light, the change in the electrical resistance of the insulating layer 752, although it depends on the size of the memory cell 721, is realized by laser light irradiation for which a beam spot is narrowed down to a diameter of μm or nm, using an optical system such as a lens. For example, when a laser beam with a diameter of 1 μm passes at a linear velocity of 10 m/sec, the length of time for which an insulating layer that is included in one memory cell 721 is irradiated with laser light, is 100 nsec. In order to change a phase within the short time of 100 nsec, laser power may be 10 mW and power density may be 10 kW/mm$^2$, for example. Furthermore, in a case of selective irradiation with laser light, it is preferable to use a pulsed laser irradiation apparatus.

Here, an example of a laser irradiation apparatus will be briefly explained with reference to FIG. 8B. A laser irradiation apparatus 1001 is equipped with a computer (hereinafter referred to as PC) 1002 which carries out various controls when laser light is emitted; a laser oscillator 1003 which outputs laser light; a power source 1004 of the laser oscillator 1003; an optical system (ND filter) 1005 which attenuates laser light; an acousto-optic modulator (AOM) 1006 for modulating the intensity of laser light; an optical system 1007 which is structured by a lens for condensing a cross-section of laser light, a mirror for changing an optical path and the like; a movement mechanism 1009 having an x-axis stage and a y-axis stage; a D/A converter portion 1010 for a digital-analog conversion of a control data that is output from the PC; a driver 1011 which controls the AOM 1006 in response to an analog voltage that is output from the D/A converter portion; a driver 1012 which outputs a driving signal for driving the movement mechanism 1009; and an auto-focus mechanism 1013 for focusing laser light on an irradiation object.

As the laser oscillator 1003, a laser oscillator that can oscillate ultraviolet light, visible light, or infrared light can be used. As the laser oscillator, a KrF, ArF, XeCl, or a Xe excimer laser oscillator; an He, He—Cd, Ar, He—Ne, HF gas laser oscillator or the like; a solid state laser oscillator using a crystal in which a YAG, GdVO$_4$, YVO$_4$, YLF, YAlO$_3$ or the like is doped with Cr, Nd, Er, Ho, Ce, Co, Ti, or Tm; or a semiconductor laser oscillator such as GaN, GaAs, GaAlAs, or InGaAsP can be used. As for a solid state laser oscillator, applying the fundamental wave or the second to the fifth harmonic is preferable.

Next, an irradiation method using the laser irradiation apparatus will be described. When the substrate 750 that is provided with the insulating layer 752 is attached to the movement mechanism 1009, the PC 1002 that detects a position of the insulating layer 752 which is to be irradiated with laser light, with a camera not shown in the figure. Subsequently, based on the detected position data, the PC 1002 generates a movement data for moving the movement mechanism 1009.

Subsequently, by the PC 1002 controlling the output light amount of the AOM 1006 via the driver 1011, the light amount of laser light output from the laser oscillator 1003, after it is attenuated by the optical system 1005, is controlled by the AOM 1006 so as to be a prescribed light amount. An optical path and a beam spot form is changed for laser light output from the AOM 1006 by the optical system 1007, and after being concentrated by a lens, laser light is emitted to the substrate 750.

At this time, the movement mechanism 1009 is controlled and moved in an x direction and a y direction in accordance with the movement data that is generated by the PC 1002. As a result, a prescribed location is irradiated with laser light, the light energy density of laser light is converted to heat energy, and an insulating layer that is provided over the substrate 750 can be selectively irradiated with laser light. Note that here, an example of carrying out laser light irradiation by moving the movement mechanism 1009 is described; however, laser light may also be moved in the x direction and the y direction by adjusting the optical system 1007.

Figure 9:
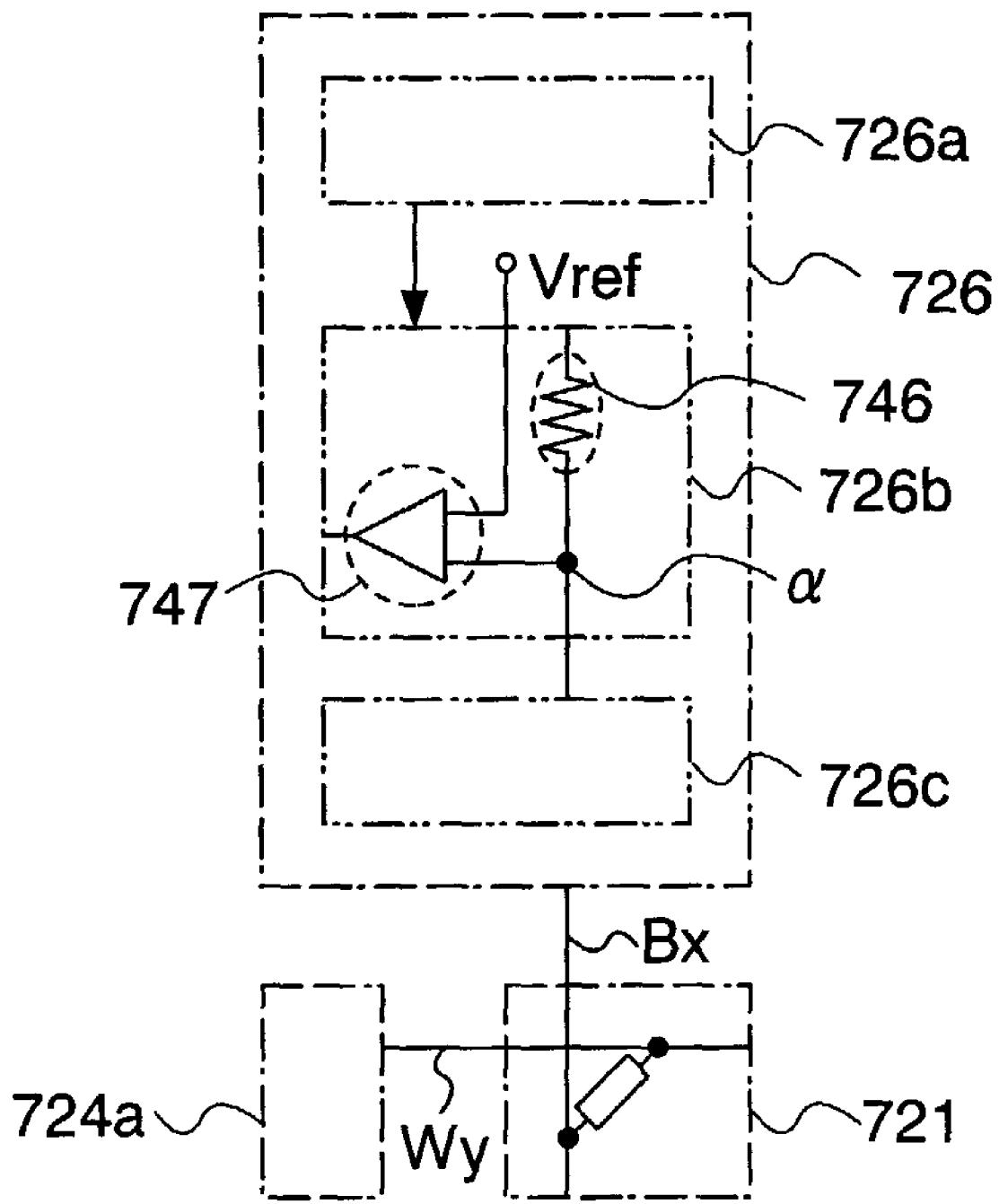
FIG. 9 describes a memory device of the present invention.

An operation when carrying out data readout from a memory device will be explained (refer to FIG. 9). Here, a readout circuit 726b is to have a structure including a resistance element 746 and a sense amplifier 747. However, a structure of the readout circuit 726b is not restricted to the above structure, and may have any kind of structure.

Data readout is carried out by applying voltage between the first conductive layer 751b and a second conductive layer 752b, and reading the electrical resistance of the insulating layer 752. For example, as mentioned above, when data writing is carried out by applying an electrical effect, a resistance value Ra1 when an electrical effect is not applied, and a resistance value Rb1 when an electrical effect is applied to cause a short circuit between the two conductive films, satisfy Ra1>Rb1. Data readout is carried out by electrically reading such a discrepancy between the resistance values.

Also, as mentioned above, when data writing is carried out by irradiating the insulating layer with laser light, a resistance value Ra2 when it is not irradiated with laser light, and a resistance value Rb2 when the insulating layer is broken down by being irradiated with laser light, satisfy Ra2<Rb2. Data readout is carried out by electrically reading such a discrepancy between the resistance values.

For example, when data readout is carried out for the memory cell 721 located in column x, row y, among a plurality of memory cells 721 that are included in the memory cell array 722, first, a bit line Bx in column x and a word line Wy in row y are selected by the row decoder 724, the column decoder 726a, and the selector 726c. When this is done, an insulating layer that is included in the memory cell 721 and the resistance element 746 become serially connected. In this manner, when voltage is applied to both ends of two resistance elements connected serially, the electrical potential of a node a becomes a resistance-divided electrical potential in accordance with a resistance value Ra or Rb of the insulating layer 752. Then, the electrical potential of the node α is supplied to the sense amplifier 747, and in the sense amplifier 747, which of the information "0" or "1" is contained is judged. Subsequently, a signal containing information "0" or "1" that is judged in the sense amplifier 747 is supplied to the exterior.

According to the above method, a condition of the electrical resistance of an insulating layer is read with a voltage value utilizing a difference between resistance values and resistance division. However, a method of comparing current values is also acceptable. This, for example, utilizes the satisfaction of Ia1<Ib1, wherein Ia1 is a current value of when an electrical effect is not applied to an insulating layer, and Ib1 is a current value of when an electrical effect is applied to cause a short circuit between the two conductive films. Also, when data writing is carried out by irradiating the insulating layer with laser light, a current value Ia2 when the insulating layer is irradiated with laser light, and a current value Ib2 when the insulating layer is broken down by irradiating it with laser light, satisfy Ia2>Ib2. In this manner, data readout may be carried out by electrically reading a discrepancy between current values.

A memory element having the above structure and a semiconductor device that is equipped with the memory element are nonvolatile memories; therefore, a battery for retaining data is not necessary. A compact size, thin, and light weight semiconductor device can be provided. Furthermore, although data writing (additional writing of data) is possible by using the insulating material used in the above embodiment modes as a insulating layer, rewriting of data cannot be carried out. Consequently, counterfeiting can be prevented and a semiconductor device with ensured security can be provided.

Note that in this embodiment mode, an explanation has been made using an example of a passive matrix type memory element which has a simple memory circuit structure and a semiconductor device equipped with the memory element; however, data writing or readout can be carried out in a similar fashion even in a case of having an active matrix type memory circuit.

Here, data readout of a memory element portion by an electrical effect in a case of an active matrix type will be explained by giving a specific example in FIGS. 14A and 14B.

Figure 14A:
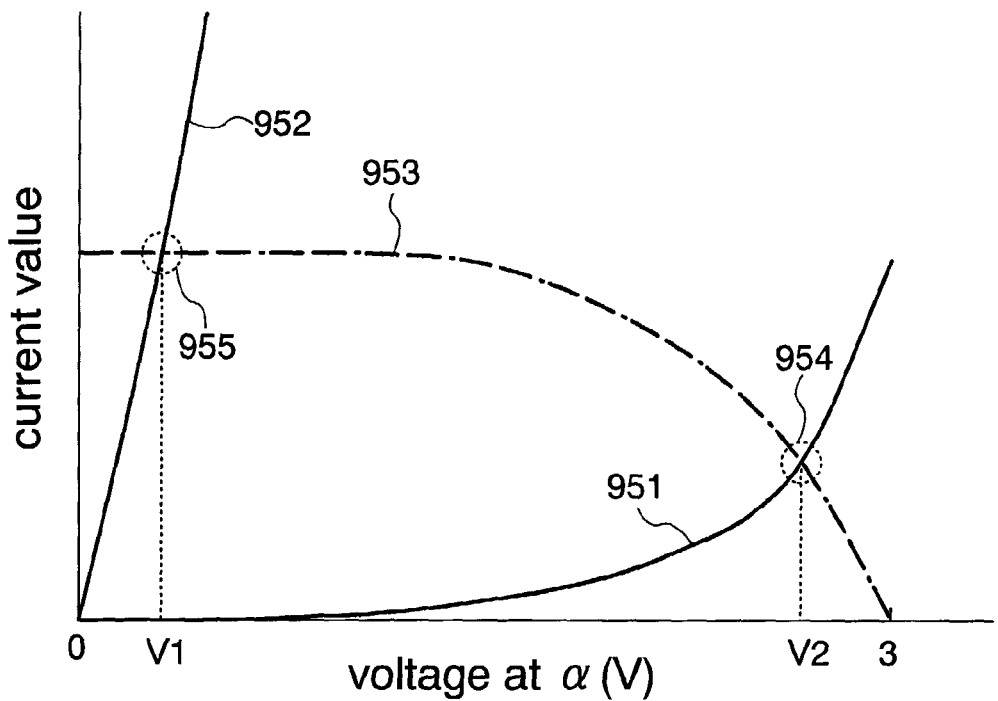
FIG. 14A shows a graph of current-voltage characteristics of components of a memory and FIG. 14B describes the memory device of the present invention.
Figure 14B:
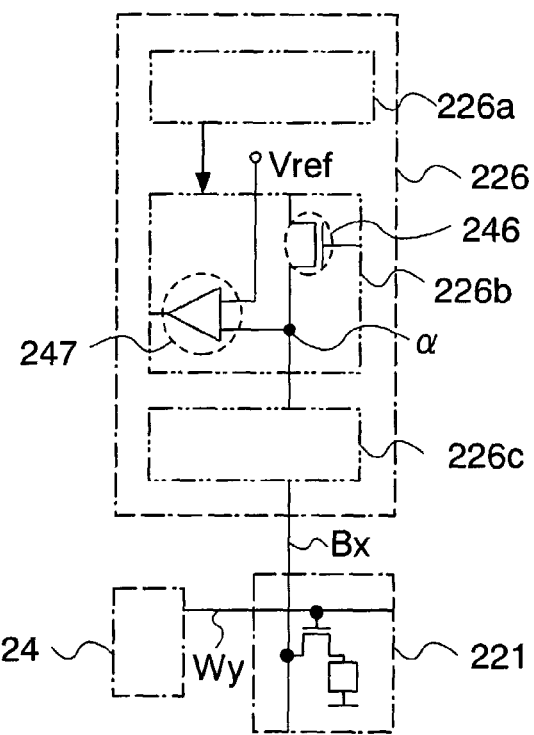

FIG. 14A shows a current-voltage characteristic 951 of a memory element portion when data "0" is written in the memory element portion; a current-voltage characteristic 952 of the memory element when data "1" is written; and a current-voltage characteristic 953 of a resistance element 246. Here a case in which a transistor is used for the resistance element 246 is shown. Furthermore, as an operating voltage for data readout, a case of applying 3 V between a first conductive layer 243 and a second conductive layer 245 will be explained.

For a memory cell in FIG. 14A having a memory element portion for which data "0" is written, an intersection point 954 of the current-voltage characteristic 951 of the memory element portion and the current-voltage characteristic 953 of the transistor becomes an operation point, and an electrical potential of the node α at this time is V2 (V). The electrical potential of the node α is supplied to a sense amplifier 247, and in the sense amplifier 247, the data that is stored in the above mentioned memory cell is judged as "0."

On the other hand, for a memory cell having a memory element portion for which data "1" is written, an intersection point 955 of the current-voltage characteristic 952 of the memory element portion and the current-voltage characteristic 953 of the transistor becomes an operation point, and an electrical potential of the node α at this time is V1 (V) (V1<V2). The electrical potential of the node α is supplied to the sense amplifier 247, and in the sense amplifier 247, the data that is stored in the above mentioned memory cell is judged as "1."

In this manner, by reading the resistance-divided electrical potential in accordance with the resistance value of the memory element portion 241, data that is stored in the memory cell can be judged.

Note that this embodiment mode can be freely combined and carried out with a structure of a memory element described in the above embodiment modes and a semiconductor device that is equipped with the memory element.

Embodiment Mode 5

Figure 12A:
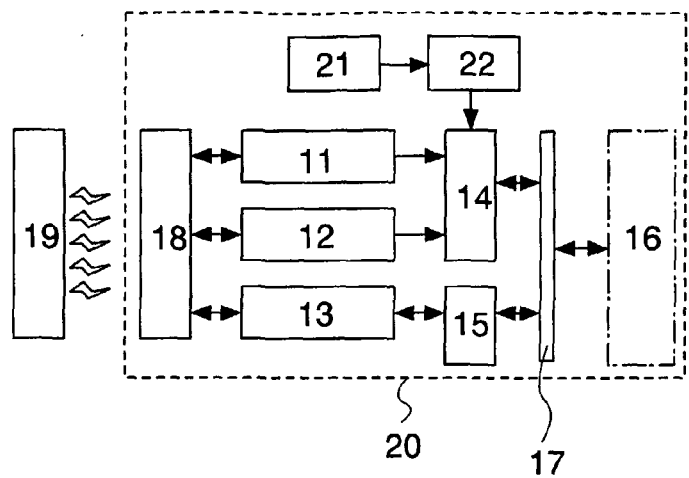
FIGS. 12A and 12B each describes a semiconductor device of the present invention.
Figure 12B:
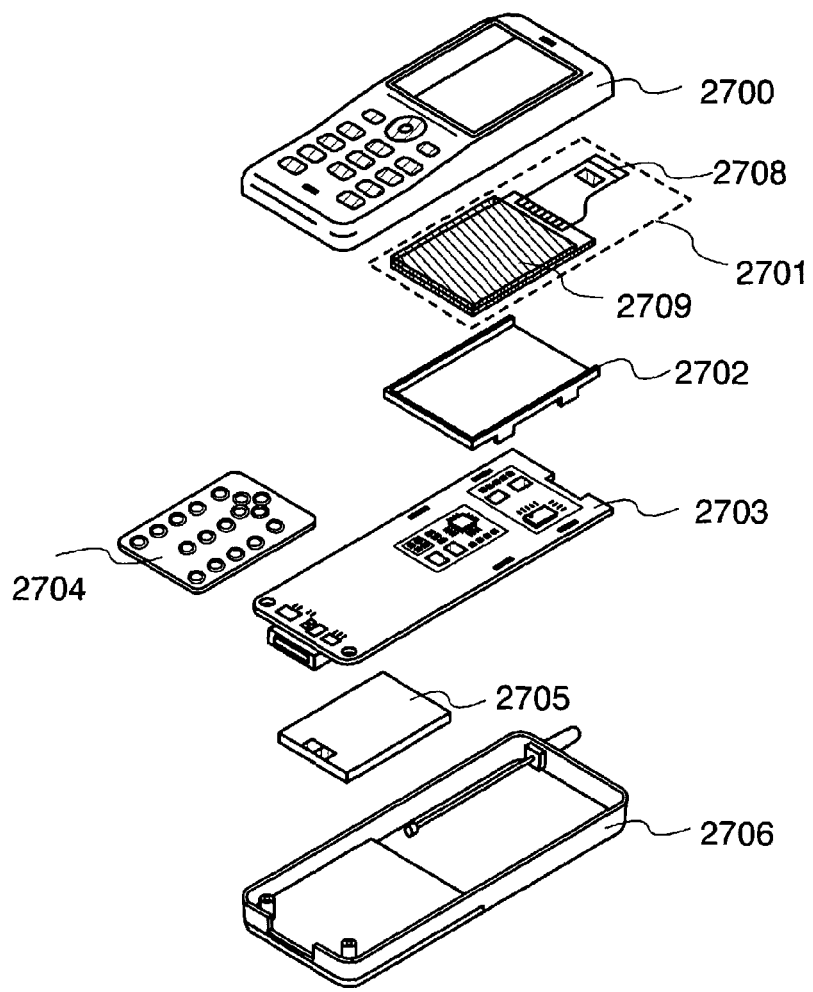

The structure of the semiconductor device of this embodiment mode will be explained with reference to FIGS. 12A and 12B. As shown in FIG. 12A, a semiconductor device 20 of the present invention has a function of data exchange without contact, and has a power source circuit 11; a clock generation circuit 12; a data demodulation/modulation circuit 13; a control circuit 14 which controls another circuit; an interface circuit 15; a memory circuit 16; a data bus 17; an antenna (antenna coil) 18; a sensor 21; and a sensor circuit 22.

The power source circuit 11 is a circuit that generates various power sources that are supplied to each circuit within the semiconductor device 20, based on an alternating current signal that is input from the antenna 18. The clock generation circuit 12 is a circuit that generates various clock signals that are supplied to each circuit within the semiconductor device 20, based on the alternating current signal that is input from the antenna 18. The data demodulation/modulation circuit 13 has a function of demodulating/modulating data that is communicated with a reader/writer 19. The control circuit 14 has a function of controlling the memory circuit 16. The antenna 18 has a function of carrying out transmission/reception of electromagnetic field or electromagnetic wave. The reader/writer 19 controls processes relating to communication with the semiconductor device, control of the semiconductor device, and data thereof. Note that the semiconductor device is not restricted to the above mentioned structure, and for example, the structure may be added with another component like a limiter circuit of power source voltage or hardware exclusively for code processing.

The memory circuit 16 is characterized by having a memory element in which an insulating layer or a phase change layer is interposed between a pair of conductive layers. The memory circuit 16 may have a memory element only, in which an insulating layer or a phase change layer is interposed between a pair of conductive layers, or may have a memory circuit of another structure. The memory circuit of another structure corresponds to, for example, one or more of a DRAM, SRAM, FeRAM, mask ROM, PROM, EPROM, EEPROM and a flash memory.

The sensor 21 is formed by a semiconductor element such as a resistance element, a capacitive coupling element, an inductive coupling element, a photovoltaic element, a photoelectric conversion element, a thermo-electromotive force element, a transistor, a thermistor, or a diode. The sensor circuit 22 detects a change in impedance, reactance, inductance, voltage, or current, then carries out an analog/digital conversion (A/D conversion), and outputs a signal to the control circuit 14.

Embodiment Mode 6

By the present invention, a semiconductor device that functions as a processor chip (also called a wireless chip, a wireless processor, a wireless memory, and a wireless tag) can be formed. Although the semiconductor device of the present invention has a wide range of use, it can be used by mounting it on bills, coins, securities, certificates, bearer bonds, packaging cases, books, recording media, personal belongings, vehicles, foods, clothes, health items, livingwares, medicals, electronic devices or the like.

Figure 13A:
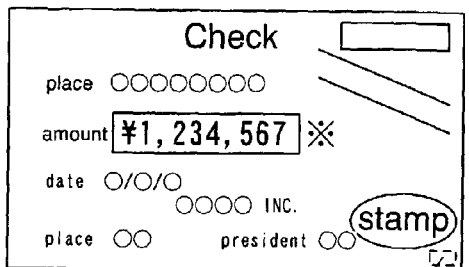
FIGS. 13A to 13G each describes a semiconductor device of the present invention.
Figure 13B:
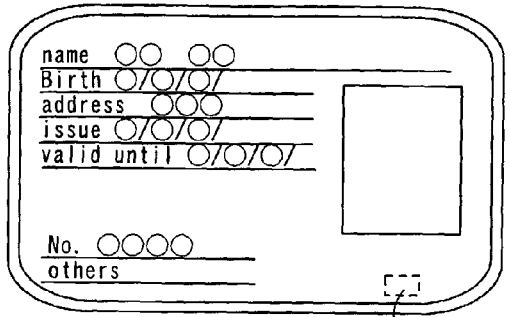
Figure 13C:
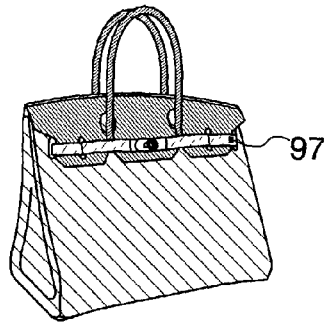
Figure 13D:
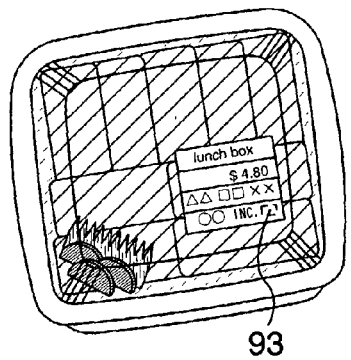
Figure 13E:
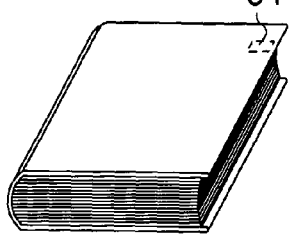
Figure 13F:
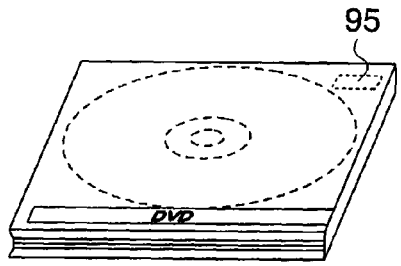
Figure 13G:
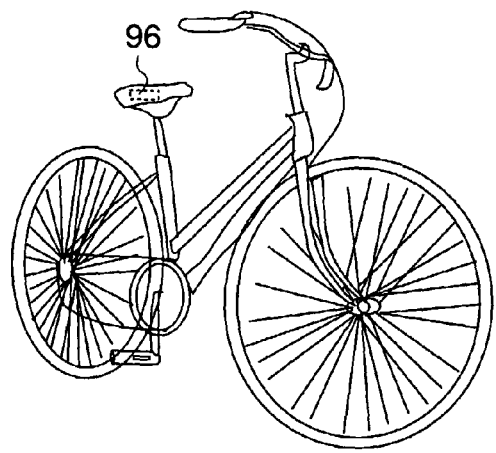

The bills and the coins mean currency in the market and include something that is used in the same way as a currency in a specific area (a cash voucher), memorial coins, and the like. The securities mean a check, a stock certificate, a promissory bill, and the like and can be provided with a processor chip 90 (refer to FIG. 13A). The certificates mean a driver's license, a resident card, and the like and can be provided with a processor chip 91 (refer to FIG. 13B). The personal belongings mean a bag, glasses, and the like and can be provided with a processor chip 97 (refer to FIG. 13C). The bearer bonds mean a stamp, a coupon for rice, various gift coupons, and the like. The packing cases mean wrapping paper for a lunch box or the like, a plastic bottle, and the like and can be provided with a processor chip 93 (refer to FIG. 13D). The books mean a book, a volume, and the like and can be provided with a processor chip 94 (refer to FIG. 13E). The recording medium means DVD software, a video tape, and the like and can be provided with a processor chip 95 (refer to FIG. 13F). The vehicles mean a wheeled vehicle such as a bicycle, a vessel, and the like and can be provided with a processor chip 96 (refer to FIG. 13G). The foods mean foodstuff, beverages, and the like. The clothes mean wear, footwear, and the like. The health items mean medical devices, health appliances, and the like. The livingwares mean furniture, a lighting apparatus, and the like. The medicals mean medicines, agricultural chemicals, and the like. The electronic devices mean a liquid crystal display device, an EL display device, a television apparatus (a TV set and a thin television set), a cellular phone, and the like.

The semiconductor device of the present invention is fixed on an item by mounting on a printed-circuit board, by affixing on a surface, or by embedding, etc. For example, it is fixed on a book by embedding it in paper, or it is fixed on a packaging case made of an organic resin, by embedding it in the organic resin. Because the semiconductor device of the present invention realizes compactness in size, thinness, and lightness in weight, it does not detract from the design of an item itself after it is fixed on the item. Also, by providing the semiconductor device of the present invention on bills, coins, securities, bearer bonds, certificates and the like, an authentication function can be provided, and by utilizing this identification/authentication function, counterfeiting can be prevented. Furthermore, by providing the semiconductor device of the present invention on packaging cases, recording media, personal belongings, foods, clothes, livingwares, electronic devices and the like, improvement in efficiency for inspection systems and the like can be achieved.

One mode of an electronic device which the semiconductor device of the present invention is mounted on is explained with reference to drawings. An example here shows a cellular phone which has casings 2700 and 2706; a panel 2701; a housing 2702; a printed wiring board 2703; an operation button 2704; and a battery 2705 (refer to FIG. 12B). The panel 2701 is detachably incorporated in the housing 2702, and the housing 2702 is fitted to the printed wiring board 2703. The form and size of the housing 2702 is appropriately changed depending on a electronic device which the panel 2701 is to be incorporated in to. On the printed wiring board 2703, a plurality of packaged semiconductor devices are mounted, and as one of these, the semiconductor device of the present invention can be used. The plurality of semiconductor devices that are mounted on the printed wiring board 2703 have any of the functions of a controller, a Central Processing Unit (CPU), a memory, a power source circuit, an audio processing circuit, a transmission/reception circuit or the like.

The panel 2701 is connected to the printed wiring board 2703 via a connection film 2708. The panel 2701, the housing 2702, and the printed wiring board 2703 are enclosed inside of the casings 2700 and 2706, along with the operation button 2704 and battery 2705. A pixel region 2709 that is included in the panel 2701 is located so that it is visible from an open window that is provided for the casing 2700.

The semiconductor device of the present invention is compact in size, thin, and light weight, and because of these characteristics, the limited space inside of the casings 2700 and 2706 of an electronic device can be used effectively.

Since the semiconductor device of the present invention has a memory element with a simple structure of an insulating layer being interposed between a pair of conductive layers, an electronic device using an inexpensive semiconductor device can be provided. Also, because higher integration is easy for the semiconductor device of the present invention, an electronic device that uses a semiconductor device having a high-capacity memory circuit can be provided.

The memory device that is included in the semiconductor device of the present invention is carried out data writing by an optical effect or an electrical effect, is nonvolatile, and is characterized by additional data writing being possible. By the above characteristic, counterfeiting by rewriting can be prevented, and new data can be additionally written. Consequently, an electronic device using the semiconductor device realizing higher function and higher added value can be provided.

Note that for the casings 2700 and 2706, an exterior form of a cellular phone is shown as an example, and an electronic device in accordance with this embodiment mode may transform in to various modes in response to the function or use.

Embodiment Mode 7

In this embodiment mode, data reading or writing for a memory device having the above structure is explained.

Figure 18A:
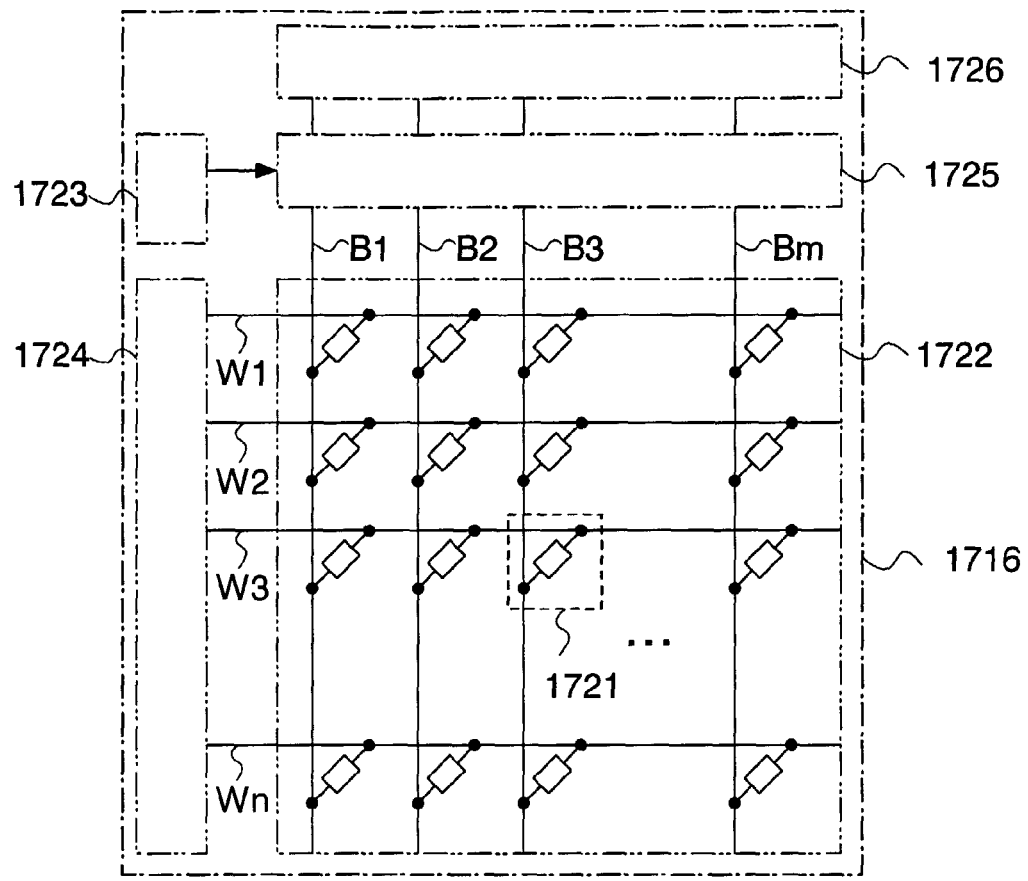
FIGS. 18A to 18C describe a memory device of the present invention.
Figures 18B, 18C:
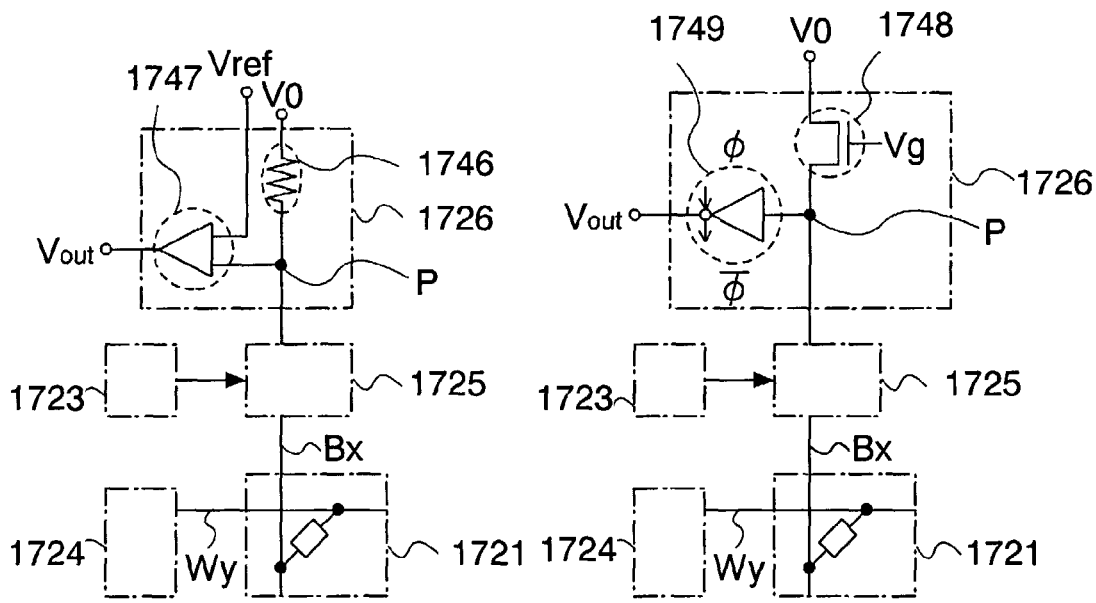

One example of a structure of the memory device of the present invention is shown in FIGS. 18A to 18C, which has a memory cell array 1722 in which memory cells 1721 are provided in a matrix form; a circuit 1726 having a readout circuit and a writing circuit; a decoder 1724, and a decoder 1723. Note that the structure of a memory device 1716 shown here is only one example, and it may have another circuit such as a sense amplifier, an output circuit, a buffer, or an interface which carries out interactions with the exterior.

A single memory cell 1721 has a first conductive layer that is connected to a bit line Bx ($1 \leq x \leq m$), a second conductive layer that is connected to a word line Wy ($1 \leq y \leq n$), and an insulating layer. The insulating layer is provided between the first conductive layer and the second conductive layer as a single layer or as a laminated layer.

An operation when carrying out data writing in a memory element of a passive matrix type memory device is explained with reference to FIGS. 18B and 18C. Data writing is carried out by an optical effect or an electrical effect. Data writing by an electrical effect is explained first. Note that writing is carried out by changing an electrical property of a memory cell, and data of an initial condition (condition when an electrical effect is not applied) of a memory cell is data "0," and a condition in which the electrical property is changed is "1."

When writing data "1" in the memory cell 1721, the memory cell 1721 is selected by the decoders 1723 and 1724, and a selector 1725. Specifically, a prescribed voltage V2 is applied to a word line Wy that is connected to the memory cell 1721, by the decoder 1724. Also, by the decoder 1723 and selector 1725, a bit line Bx that is connected to the memory cell 1721, is connected to the circuit 1726. Then, a writing voltage V1 is output from the circuit 1726 to the bit line Bx. In this way, a voltage Vw=V1−V2 is applied between the first conductive layer and the second conductive layer which structure the memory cell 1721. By appropriately choosing voltage Vw, an insulating layer that is provided between the conductive layers is changed physically or electrically, and writing of data "1" is carried out. Specifically, at a readout operation voltage, it is preferable to change the electric resistance between the first conductive layer and the second conductive layer in a data "1" condition, so as to be significantly lower compared to that in a data "0" condition. For example, voltage may be appropriately selected from the range of (V1, V2)=(0V, 5 to 15V), or (3 to 5V, −12 to −2V). Voltage Vw may be 5 to 15V, or −5 to −15V.

Note that an unselected word line and an unselected bit line are controlled so that data "1" is not written in a memory cell that is connected thereto. For example, the unselected word line and the unselected bit line may be in suspension. The first conductive layer and the second conductive layer are required to have diode characteristics and the like by which lines can be accurately selected.

On the other hand, data "0" is written in the memory cell 1721 by not applying an electrical effect on the memory cell 1721. In terms of circuit operation, the memory cell 1721 is selected by the decoders 1723 and 1724, and the selector 1725 in the same manner as when "1" is written; however, a output electrical potential from the circuit 1726 to the bit line Bx is to be comparable to an electrical potential of a selected word-line Wy or an electrical potential of an unselected word line, and in between the first conductive layer and the second conductive layer that structure the memory cell 1721, a voltage of a degree that does not change the electrical property of the memory cell 1721 (for example, −5 to 5V) may be applied.

Next, a case where data writing is carried out by an optical effect is explained. In this case, a second conductive layer needs to transmit laser light. It is carried out by irradiating an insulating layer with laser light from the side of a conductive layer having a light-transmitting property. Here, the insulating layer is broken down by selectively irradiating a desired portion of the insulating layer with laser light. Because the insulating layer that is broken down becomes more insulating, the electrical resistance becomes substantially higher compared to other portions. In this manner, data writing is carried out by utilizing a change in the electrical resistance by laser light irradiation between two conductive films which sandwiches an insulating layer. For example, when an insulating layer that is not irradiated with laser light is data "0," data "1" is written by selectively irradiating a desired portion of the insulating layer with laser light, breaking it down, and making the electrical resistance high.

When laser light irradiation is carried out in a case of using a conjugate high molecular weight material that is doped with a compound that generates acid by absorbing light (photoacid generator) as a insulating layer, only a portion that is irradiated with laser light increases in conductivity, and a portion which is not irradiated with laser light does not have conductivity. Consequently, data writing is carried out by utilizing a change in the electrical resistance by selectively irradiating a desired portion of the insulating layer with laser light. For example, when an insulating layer which is not irradiated with laser light is data "0," and when data "1" is written, a desired portion of the insulating layer is selectively irradiated with laser light to increase conductivity.

The structure which carries out data writing by laser light irradiation according to the present invention can easily writing date for memory devices. Therefore, an inexpensive memory device and semiconductor device can be provided.

An operation of carrying out data readout from a memory element for a passive matrix type memory device is explained (refer to FIGS. 18A to 18C). Data readout is carried out by utilizing a difference in the electronic properties, between a first conductive layer and a second conductive layer which structure a memory cell, of a memory cell having data "0" and a memory cell having data "1." As an example, a method of readout utilizing a difference in an electrical resistance is explained, where an effective electrical resistance (hereinafter simply referred to as an electrical resistance of a memory cell) between a first conductive layer and a second conductive layer that structure a memory cell having data "0" is R0 at readout voltage, and when an electrical resistance of a memory cell having data "1" is R1 at readout voltage. Note that R1<<R0. For a structure of a readout portion of a readout/writing circuit, for example, the circuit 1726 using a resistance element 1746 and a differential amplifier 1747 as shown in FIG. 18B can be considered. The resistance element 1746 has a resistance value Rr which is to be R1<Rr<R0. It is also possible to use a transistor 1748 in the place of the resistance element 1746, and a clocked inverter 1749 in the place of the differential amplifier (FIG. 18C). In the clocked inverter 1749, a signal ϕ or an inversion signal ϕ, which becomes Hi when readout is carried out and becomes Lo when it is not carried out, is input. Needless to say, a circuit structure is not limited to that of FIGS. 18A to 18C.

When data readout from the memory cell 1721 is carried out, the memory cell 1721 is selected first by the decoders

1723 and 1724, and the selector 1725. Specifically, by the decoder 1724, a prescribed voltage Vy is applied to a word line Wy that is connected to the memory cell 1721. Also, by the decoder 1723 and the selector 1725, a bit line Bx that is connected to the memory cell 1721, is connected to a terminal P of the circuit 1726. As a result, an electrical potential Vp of the terminal P is a value that is determined by a resistance division by the resistance element 246 (resistance value Rr) and the memory cell 1721 (resistance value R0 or R1). Consequently, when the memory cell 1721 has data "0" Vp0=Vy+ (V0−Vy)×R0/(R0+Rr). Furthermore, when the memory cell 1721 has data "1," Vp1=Vy+(V0−Vy)×R1/(R1+Rr). As a result, in FIG. 18B, by selecting Vref so as to be between Vp0 and Vp1; and in FIG. 18C, by selecting a point of variation of the clocked inverter so as to be between Vp0 and Vp1, readout can be carried out by outputting Lo/Hi (or Hi/Lo) as an output electrical potential Vout, in response to data "0"/"1."

For example, the differential amplifier is operated with Vdd=3V, wherein Vy=0V, V0=3V, and Vref=1.5V. Suppose that R0/Rr=Rr/R1=9, then in a case where data of a memory cell is "0," Vp0=2.7V, and Hi is output as Vout; and in a case where data of a memory cell is "1," Vp1=0.3V, and Lo is output as Vout. In this way, readout of a memory cell can be carried out.

According to the above method, the condition of the electrical resistance of the insulating layer is read with a voltage value by utilizing a discrepancy in resistance values and resistance division. Needless to say, a readout method is not limited to this method. For example, other than using a difference in electrical resistance, readout my be carried out by using a difference in current value. Also, when the electrical property of a memory cell has a diode characteristic where threshold voltages differ with data "0" and "1," the difference in the threshold voltages may be used for readout.

Figure 19A:
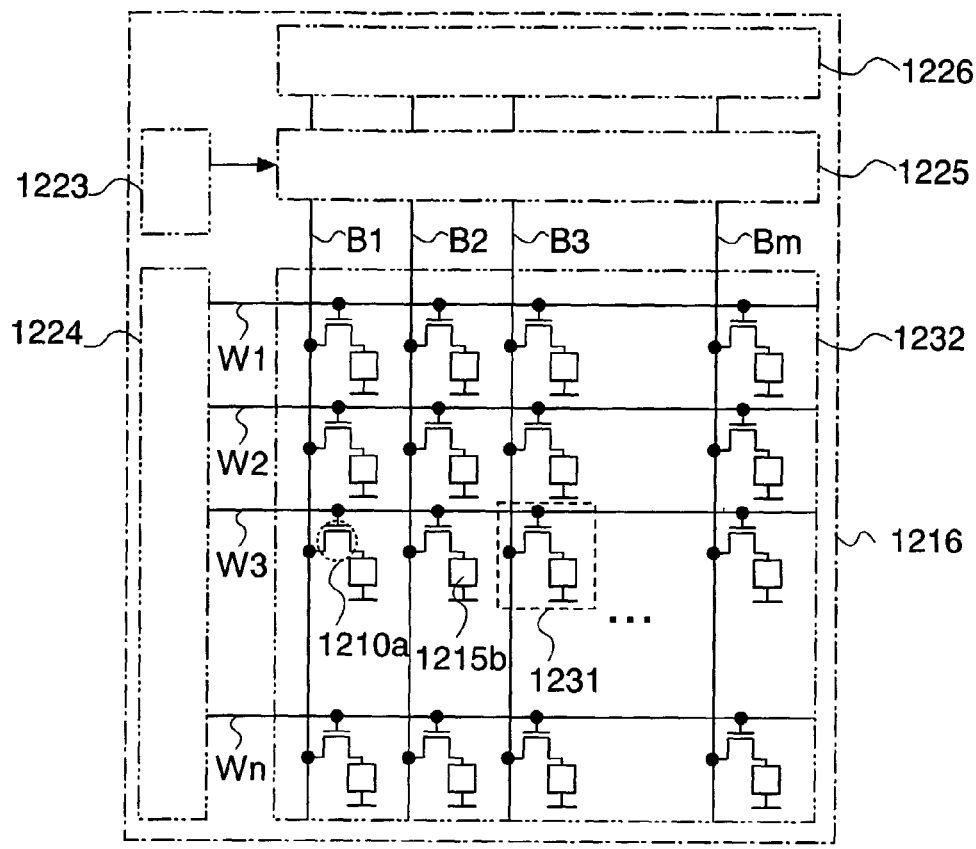
FIGS. 19A to 19C describe a memory device of the present invention.
Figures 19B, 19C:
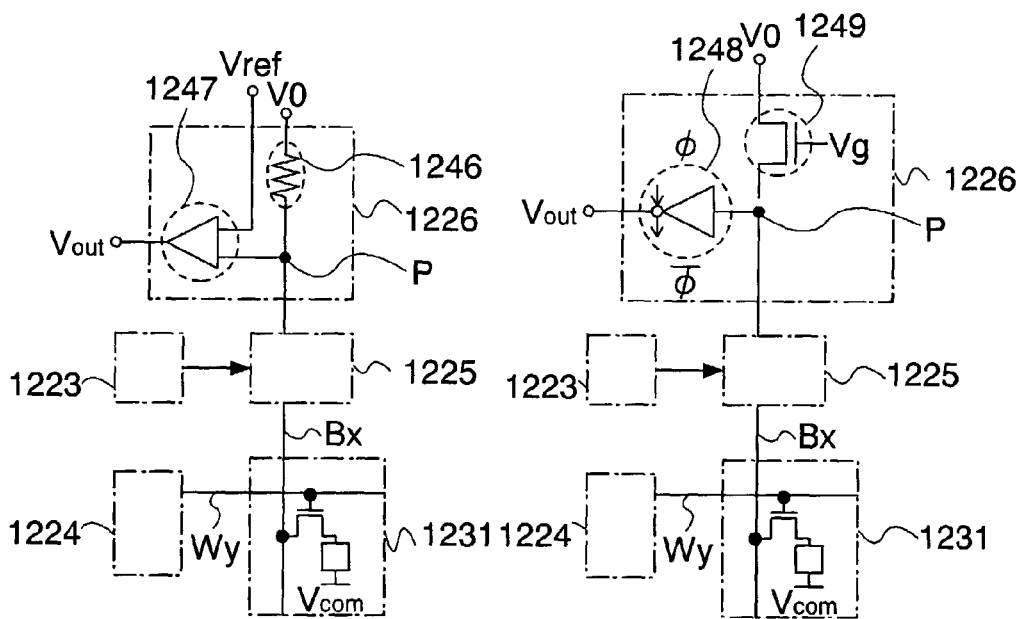

An operation when carrying out data writing in a memory element of an active matrix type memory device is explained (refer to FIGS. 19A to 19C).

FIGS. 19A to 19C show one structural example of a memory device that is shown in this embodiment mode, which includes a memory cell array 1232 in which memory cells 1231 are provided in a matrix form, a circuit 1226, a decoder 1224, and a decoder 1223. The circuit 1226 has a readout circuit and a writing circuit. Note that the structure of a memory device 1216 that is shown here is only one example, and another circuit such as a sense amplifier, an output circuit, a buffer, an interface carrying out interactions with the exterior, or the like may be included.

The memory cell array 1232 has a first wiring that is connected to a bit line Bx (1≦x≦m), a second wiring that is connected to a word line Wy (1≦y≦n), a transistor 1210a, a memory element 1215b, and a memory cell 1231. The memory element 1215b has a structure in which an insulating layer is interposed between a pair of conductive layers. A gate electrode of the transistor is connected to the word line, either a source electrode or a drain electrode is connected to a bit line, and the other is connected to one of two terminals that the memory element has. The other terminal of the memory element is connected to a common electrode (electrical potential Vcom).

First, an operation when carrying out data writing by an electrical effect is explained. Note that writing is carried out by changing an electrical property of a memory cell, and data of an initial condition (condition when an electrical effect is not applied) of the memory cell is data "0," and a condition in which the electrical property is changed is "1."

Here, data writing for the memory cell 1231 that is located in row n and column m is explained. When data "1" is written in the memory cell 1231, the memory cell 1231 is first selected by the decoders 1223 and 1224, and a selector 1225. Specifically, a prescribed voltage V22 is applied to a word line Wy that is connected to the memory cell 1231, by the decoder 1224. Also, by the decoder 1223 and the selector 1225, a bit line Bx that is connected to the memory cell 1231 is connected to the circuit 1226 that has the readout circuit and the writing circuit. Then, a writing voltage V21 is output from the circuit 1226 to the bit line Bx.

In this way, the transistor 1210a that structures the memory cell is turned on, the bit line is electrically connected to the memory element 1215b, and voltage of about Vw=Vcom−V21 is applied. Note that an electrode of the memory element 1215b is connected to a common electrode having an electrical potential Vcom. By appropriately selecting an electrical potential Vw, the insulating layer that is provided between the conductive layers is changed physically or electrically, and writing of data "1" is carried out. Specifically, at readout operation voltage, the electrical resistance between the first conductive layer and the second conductive layer for a data "1" condition is to change so as to be significantly lower compared to that of a data "0" condition, or they may simply be short-circuited. The electrical potential may be appropriately selected from the range of (V21, V22, Vcom)=(5 to 15V, 5 to 15V, 0V) or (−12 to 0V, −12 to 0V, 3 to 5V). The electrical potential Vw may be 5 to 15V or −5 to −15V.

An unselected word line and an unselected bit line are controlled so that data "1" is not written in a memory cell that is connected thereto. Specifically, to the unselected word line, voltage (for example, 0V) which turns off the transistor of the connected memory cell may be applied; and the unselected bit line may be in suspension, or an electrical potential comparable to Vcom may be applied.

On the other hand, data "0" is written in the memory cell 1231 by not applying an electrical effect to the memory cell 1231. In terms of circuit operation, for example, in the same manner as when writing "1," the memory cell 1231 is selected by the decoders 1223 and 1224, and selector 1225; however, the output electrical potential from the circuit 1226 to the bit line Bx is to be comparable to Vcom, or the bit line Bx is to be in suspension. As a result, to the memory element 1215b, low voltage (for example, −5 to 5V) is applied or no voltage is applied; therefore, the electrical property does not change, and writing of data 101 is realized.

Subsequently, a case where data writing is carried out by an optical effect is explained. In this case, it is carried out by carrying out laser light irradiation with a laser irradiation apparatus, from the side of a conductive layer having a light-transmitting property, on an insulating layer. For the laser irradiation apparatus, one comparable to the apparatus for a passive matrix type memory device explained with reference to FIG. 8B may be used.

When an organic compound material is used as the insulating layer, the insulating layer becomes more insulating by laser light irradiation due to oxidation or carbonization. Thus, the resistance value of a memory element that is irradiated with laser light increases, whereas the resistance value of a memory element that is not irradiated with laser light does not change. Also, when a conjugate high molecular weight material that is doped with a photoacid generator is used, a conductive property is given to the insulating layer by laser light irradiation. In other words, a conductive property is given to the memory element that is irradiated with laser light, and a conductive property is not given to the memory element that is not irradiated with laser light.

Subsequently, an operation when data readout is carried out by an electrical effect is explained. Here, the circuit 1226 has a structure including a resistance element 1246 and a differential amplifier 1247. However, the structure for the circuit 1226 is not restricted to the above structure, and may have any kind of structure.

An operation carrying out data readout by an electrical effect for an active matrix type memory device is explained. Data readout is carried out by utilizing the difference in electrical properties of the memory element 1215b between a memory cell having data "0" and a memory cell having data "1." As an example, a method of readout utilizing a difference in an electrical resistance is explained, where an electrical resistance between a first conductive layer and a second conductive layer that structure a memory cell having data "0" is R0 at readout voltage, and when the electrical resistance of a memory cell having data "1" is R1 at readout voltage. Note that R1<<R0. For a structure of a readout portion of a readout/writing circuit, for example, the circuit 1226 using a resistance element 1246 and a differential amplifier 1247 as shown in FIG. 19B can be considered. The resistance element has a resistance value Rr for which R1<Rr<R0. It is also possible to use a transistor 1249 in the place of the resistance element 1246, and a clocked inverter 1248 in the place of the differential amplifier (FIG. 19C). Needless to say, a circuit structure is not limited to that of FIGS. 19A to 19C.

When data readout is carried out from a memory cell 1231 in row x and column y, the memory cell 1231 is first selected by the decoders 1223 and 1224, and the selector 1225. Specifically, by the decoder 1224, a prescribed voltage V24 is applied to a word line Wy that is connected to the memory cell 1231, and the transistor 1210a is turned on. Also, by the decoder 1223 and the selector 1225, a bit line Bx that is connected to the memory cell 1231, is connected to a terminal P of the circuit 1226. As a result, an electrical potential Vp of the terminal P is determined by a resistance division of Vcom and V0 by the resistance element 1246 (resistance value Rr) and the memory element 1215b. Consequently, when the memory cell 1231 has data "0," Vp0=Vcom+(V0−Vcom)×R0/(R0+Rr). Also, when the memory cell 1231 has data "1," Vp1=Vcom+(V0−Vcom)×R1/(R1+Rr). As a result, in FIG. 19B, by selecting Vref to be between Vp0 and Vp1, and in FIG. 19C, by selecting a point of variation of a clocked inverter to be between Vp0 and Vp1, readout can be carried out by outputting Lo/Hi (or Hi/Lo) as an output electrical potential Vout, in response to data "0"/"1."

For example, the differential amplifier is operated at Vdd=3V, wherein Vcom=0V, V0=3V, and Vref=1.5V. Suppose that R0/Rr=Rr/R1=9, and if an on-resistance of the transistor 1210a can be ignored, then in a case where data of a memory cell is "0," Vp0=2.7V, and Hi is output for Vout; and in a case where data of a memory cell is "1," Vp1=0.3V, and Lo is output for Vout. In this way, readout of a memory cell can be carried out.

According to the above mentioned method, readout is carried out by a voltage value by utilizing a discrepancy in resistance values of the memory element 1215b, and resistance division. Needless to say, a readout method is not limited to this method. For example, other than using difference in electrical resistance, readout may be done by using difference in current value. Also, when an electrical property of a memory cell has a diode characteristic which has a different threshold voltage with data "0" and "1", the difference in the threshold voltages may be used for readout.

A memory element having the above structure and a memory device and a semiconductor device that are equipped with the memory element are nonvolatile memories; therefore, a battery for retaining data need not be built in, and a compact size, thin, and light weight semiconductor device can be provided. Furthermore, although data writing (additional writing of data) is possible by using the insulating material used in the above embodiment modes as a insulating layer, rewriting of data cannot be carried out. Consequently, counterfeiting can be prevented and a memory device and a semiconductor device with ensured security can be provided.

Note that this embodiment mode can be freely combined and carried out with a structure of a memory element that is described in the above mentioned embodiment modes, and a memory device and a semiconductor device that are equipped with the memory element.

This application is based on Japanese Patent Application Serial No. 2005-035258 filed in Japan Patent Office on Feb. 10, 2005, the entire contents of which are hereby incorporated by reference.

EXPLANATION OF REFERENCES

1001: laser irradiation apparatus, 1002: PC, 1003: laser oscillator, 1004: power source, 1005: optical system, 1006: acousto-optic modulator, 1007: optical system, 1009: movement mechanism, 1010: D/A converter portion, 1011: driver, 1012: driver, 1013: auto-focus mechanism, 11: power source circuit, 12: clock generation circuit, 1210a: transistor, 1215b: memory element, 1216: memory device, 1223: decoder, 1224: decoder, 1225: selector, 1226: circuit, 1231: memory cell, 1232: memory cell array, 1246: resistance element, 1247: differential amplifier, 1248: clocked inverter, 1249: transistor, 13: data demodulation/modulation circuit, 14: control circuit, 15: interface circuit, 16: memory circuit, 17: data bus, 1716: memory device, 1721: memory cell, 1722: memory cell array, 1723: decoder, 1724: decoder, 1725: selector, 1726: circuit, 1746: resistance element, 1747: differential amplifier, 1748: transistor, 1749: clocked inverter, 18: antenna, 19: reader/writer, 20: semiconductor device, 200: substrate, 201a: insulating layer, 201b: insulating layer, 202: wiring, 202a: gate electrode layer, 202b: gate electrode layer, 204a: semiconductor layer, 204b: semiconductor layer, 205a: wiring, 205b: wiring, 206a: first conductive layer, 206b: first conductive layer, 207: partition (insulating layer), 208: insulating layer, 209: insulating layer, 21: sensor, 210a: transistor, 210b: transistor, 211: insulating layer, 212: insulating layer, 213: second conductive layer, 214: insulating layer, 215a: memory element, 215b: memory element, 216: memory device, 22: sensor circuit, 223: interface, 224: word line driving circuit, 224a: row decoder, 224b: level shifter, 226: bit line driving circuit, 226a: column decoder, 226b: circuit, 226c: selector, 231: memory cell, 232: memory cell array, 241: memory element portion, 243: first conductive layer, 245: second conductive layer, 246: resistance element, 247: sense amplifier, 250: single crystal semiconductor substrate, 255a: source electrode layer or drain electrode layer, 255b: source electrode layer or drain electrode layer, 255c: source electrode layer or drain electrode layer, 255d: source electrode layer or drain electrode layer, 256a: first conductive layer, 256b: first conductive layer, 260a: field effect transistor, 260b: field effect transistor, 261: insulating layer, 262a: insulating layer, 262b: insulating layer, 263: second conductive layer, 264: insulating layer, 265a: memory element, 265b: memory element, 267: partition (insulating layer), 268: element isolation region, 269: insulating layer, 270: insulating layer, 2700: casing, 2701: panel, 2702: housing, 2703: printed wiring board, 2704: operation button, 2705: battery, 2708: connection film, 2709: pixel region, 280: substrate, 281: gate electrode layer, 282: amorphous semiconductor layer, 283a: semiconductor layer, 283b: semiconductor layer, 285: source electrode layer or drain electrode layer, 286a: first conductive layer, 286b: first conductive layer, 287: partition (insulating layer), 288: insulating layer, 290a: transistor, 290b: transistor, 292: insulating layer, 293: second conductive layer, 294: insulating layer, 295a: memory element, 295b: memory element, 30: memory element, 300: substrate, 301a: insulating layer, 301b: insulating layer, 306a: first conductive layer, 306b: first conductive layer, 307a: partition (insulating layer), 307b: partition (insulating layer), 307c: partition (insulating layer), 308: insulating layer, 310a: transistor, 310b: transistor, 310c: transistor, 310d: transistor, 311: insulating layer, 312: insulating layer, 313: second conductive layer, 314: insulating layer, 315a: memory element, 315b: memory element, 316: insulating layer, 320a: transistor, 320b: transistor, 325: memory element portion, 330: transistor portion, 335: element formation layer, 340: transistor portion, 341: conductive layer, 343: conductive layer, 350: substrate, 351a: insulating layer, 351b: insulating layer, 353: conductive layer, 356: first conductive layer, 357a: partition (insulating layer), 357b: partition (insulating layer), 357c: partition (insulating layer), 358: insulating layer, 360a: transistor, 360b: transistor, 361: insulating layer, 362a: insulating layer, 362b: insulating layer, 363a: second conductive layer, 363b: second conductive layer, 364: insulating layer, 365a: memory element, 365b: memory element, 366: insulating layer, 370a: transistor, 370b: transistor, 375: memory element portion, 380: transistor portion, 385: element formation layer, 390: transistor portion, 393: conductive layer, 394: conductive fine particle, 395: resin, 396: substrate, 47: sense amplifier, 50: first conductive layer, 51a: partition (insulating layer), 51b: partition (insulating layer), 52: insulating layer, 53: second conductive layer, 54a: arrow, 54b: arrow, 55: region, 600: substrate, 601a: first conductive layer, 601b: first conductive layer, 601c: first conductive layer, 602: liquid repellant layer, 603: light source, 606: light, 607a: region, 607b: region, 607c: region, 608a: liquid repellant layer, 608b: liquid repellant layer, 608c: liquid repellant layer, 610: substrate, 611a: first conductive layer, 611b: first conductive layer, 611c: first conductive layer, 612: liquid repellant layer, 613: light source, 614: light absorbing layer, 616: light, 617a: region, 617b: region, 617c: region, 618a: liquid repellant layer, 618b: liquid repellant layer, 618c: liquid repellant layer, 711a: first conductive layer, 711b: first conductive layer, 711c: first conductive layer, 716: memory device, 721: memory cell, 722: memory cell array, 723: decoder, 724: decoder, 724a: row decoder, 724b: level shifter, 726: circuit, 726a: column decoder, 726b: circuit, 726c: selector, 746: resistance element, 747: sense amplifier, 750: substrate, 751a: first conductive layer, 751b: first conductive layer, 751c: first conductive layer, 752: insulating layer, 753a: second conductive layer, 753b: second conductive layer, 753c: second conductive layer, 754: insulating layer, 755: partition (insulating layer), 760: substrate, 761a: first conductive layer, 761b: first conductive layer, 761c: first conductive layer, 762: insulating layer, 763a: second conductive layer, 763b: second conductive layer, 763c: second conductive layer, 764: insulating layer, 765: partition (insulating layer), 770: substrate, 771a: first conductive layer, 771b: first conductive layer, 771c: first conductive layer, 772: insulating layer, 773a: second conductive layer, 773b: second conductive layer, 773c: second conductive layer, 774: partition (insulating layer), 775: partition (insulating layer), 776a: liquid repellant layer, 776b: liquid repellant layer, 776c: liquid repellant layer, 780: substrate, 781a: first conductive layer, 781b: first conductive layer, 781c: first conductive layer, 782: insulating layer, 783a: second conductive layer, 783b: second conductive layer, 783c: second conductive layer, 784: insulating layer, 785: partition (insulating layer), 786a: liquid repellant layer, 786b: liquid repellant layer, 786c: liquid repellant layer, 90: processor chip, 91: processor chip, 93: processor chip, 94: processor chip, 95: processor chip, 951: current-voltage characteristic, 952: current-voltage characteristic, 953: current-voltage characteristic, 954: intersection point, 955: intersection point, 96: processor chip, 97: processor chip.

The invention claimed is:

1. A semiconductor device comprising:
  a first conductive layer;
  a first insulating layer covering an end portion of the first conductive layer;
  a liquid repellant layer over the first conductive layer;
  a second insulating layer over the liquid repellant layer and the first insulating layer; and
  a second conductive layer over the second insulating layer,
  wherein the second insulating layer comprises an insulating material, and wettability against a fluidized substance of the insulating material is higher for the first insulating layer than the liquid repellant layer,
  wherein the second insulating layer is in contact with the liquid repellant layer and the second conductive layer, and
  wherein the insulating material comprises an organic compound having a property that the conductivity changes by an electrical effect or an optical effect.

2. The semiconductor device according to claim 1, wherein the liquid repellant layer includes a substance having a fluorocarbon group.

3. The semiconductor device according to claim 1, wherein the first conductive layer and the second conductive layer partially are in contact with each other after data writing to the semiconductor device.

4. The semiconductor device according to claim 1, wherein a thickness of the second insulating layer changes after data writing to the semiconductor device.

5. The semiconductor device according to claim 1, wherein a small amount of current flows through the second insulating layer.

6. The semiconductor device according to claim 1, wherein the liquid repellant layer includes a material having a fluorocarbon group.

7. The semiconductor device according to claim 1, wherein the liquid repellant layer comprises any one of a polytetrafluoroethylene resin, a tetrafluoroethylene perfluoroalkylvinylether copolymer resin, a tetrafluoroethylene hexafluoropropylene copolymer resin, a tetrafluoroethylene-ethylene copolymer resin, a polyvinylidene fluoride resin, a polytrifluorochloroethylene resin, a polytrifluorochloroethylene-ethylene copolymer resin, polytetrafluoroethylene-perfluorodioxol copolymer, and a vinyl fluoride resin.

8. The semiconductor device according to claim 1, wherein the liquid repellant layer includes a substance having a silane coupling agent.

9. The semiconductor device according to claim 8, wherein the silane coupling agent has an alkyl group.

10. The semiconductor device according to claim 1, wherein the liquid repellant layer includes a light absorber which has an absorption region in a wavelength range of light.

11. The semiconductor device according to claim 10, wherein the light absorber is carbon black or a black resin of a colorant.

12. The semiconductor device according to claim 1, wherein the second insulating layer comprises the organic compound and an inorganic compound.

13. The semiconductor device according to claim 12, wherein the organic compound is an aromatic amine compound, and
wherein the inorganic compound is a metal oxide of the transition metals in group 4 to group 12 of the periodic table.

14. The semiconductor device according to claim 13, wherein the inorganic compound is a molybdenum oxide.

* * * * *